US008550875B2

(12) United States Patent
Torii et al.

(10) Patent No.: US 8,550,875 B2
(45) Date of Patent: Oct. 8, 2013

(54) METHOD OF OPERATING SUBSTRATE PROCESSING APPARATUS AND SUBSTRATE PROCESSING APPARATUS

(75) Inventors: Hiroomi Torii, Tokyo (JP); Hiroaki Nishida, Tokyo (JP); Hiroyuki Kaneko, Tokyo (JP); Misao Date, Tokyo (JP); Takashi Mitsuya, Tokyo (JP); Takamasa Nakamura, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 13/474,898

(22) Filed: May 18, 2012

(65) Prior Publication Data
US 2012/0231703 A1 Sep. 13, 2012

Related U.S. Application Data

(62) Division of application No. 12/320,251, filed on Jan. 22, 2009, now Pat. No. 8,202,139.

(30) Foreign Application Priority Data

Jan. 23, 2008 (JP) .................. 2008-012636
Jan. 13, 2009 (JP) .................. 2009-004315

(51) Int. Cl.
*B24B 49/00* (2012.01)

(52) U.S. Cl.
USPC ...................... 451/5; 451/8; 451/67

(58) Field of Classification Search
USPC ............... 451/5, 8, 11, 285–290, 67
See application file for complete search history.

(56) References Cited

U.S. PATENT DOCUMENTS

| 4,687,542 | A | * | 8/1987 | Davis et al. ............ 438/716 |
| 4,822,450 | A | * | 4/1989 | Davis et al. ............ 438/709 |
| 4,875,989 | A | * | 10/1989 | Davis et al. ............ 204/298.33 |
| 4,916,091 | A | * | 4/1990 | Freeman et al. ............ 438/784 |
| 5,138,973 | A | * | 8/1992 | Davis et al. ............ 118/723 MP |

(Continued)

FOREIGN PATENT DOCUMENTS

| EP | 330229 A | * 8/1989 | ................ F16P 3/08 |
| EP | 0 885 691 | 12/1998 | |
| JP | 5-190529 | 7/1993 | |
| JP | 8-102459 | 4/1996 | |
| JP | 2004-22940 | 1/2004 | |
| JP | 2007-301690 | 11/2007 | |
| WO | 2006/009304 | 1/2006 | |
| WO | 2007/099976 | 9/2007 | |

OTHER PUBLICATIONS

International Search Report issued May 8, 2007 in International (PCT) Application No. JP2007/053699.
European Search Report issued Apr. 14, 2009 in European Application No. 09000972.1.

*Primary Examiner* — Maurina Rachuba
(74) *Attorney, Agent, or Firm* — Wenderoth, Lind & Ponack, L.L.P.

(57) ABSTRACT

A method of operating a substrate processing apparatus, upon the occurrence of a nonfatal failure in the apparatus, makes it possible to continue part of the apparatus operations for substrates to clean and recover a substrate or to easily discharge a substrate from the apparatus, without stopping an entire apparatus, thereby reducing the risk of a substrate becoming unprocessable. The method of operating a substrate processing apparatus having a polishing section, a cleaning section and a transferring mechanism, includes: classifying substrates, upon detection of a malfunction in any of the polishing section, the cleaning section and the transferring mechanism, according to the site of the malfunction and to the positions of the substrates in the substrate processing apparatus; and carrying out an operation for each of the substrates after the detection of the malfunction, the operation varying depending on the classification of the substrate.

8 Claims, 24 Drawing Sheets

(56) References Cited

U.S. PATENT DOCUMENTS

| | | | |
|---|---|---|---|
| 5,248,636 A * | 9/1993 | Davis et al. | 438/709 |
| 5,558,180 A * | 9/1996 | Yanagisawa | 184/11.2 |
| 5,887,602 A | 3/1999 | Iwama | |
| 6,074,276 A | 6/2000 | Shibata et al. | |
| 6,935,930 B2 | 8/2005 | Fujita | |
| 2002/0186368 A1 | 12/2002 | Rosengaus et al. | |
| 2003/0236057 A1 * | 12/2003 | Fujita | 451/41 |
| 2004/0033761 A1 | 2/2004 | Ono et al. | |

* cited by examiner

METHOD OF OPERATING SUBSTRATE PROCESSING APPARATUS AND SUBSTRATE PROCESSING APPARATUS

This application is a Divisional of U.S. application Ser. No. 12/320,251, filed Jan. 22, 2009 now U.S. Pat. No. 8,202,139.

BACKGROUND OF THE INVENTION

1. Field of the Invention

The present invention relates to a substrate processing apparatus and a method of operating a substrate processing apparatus, and more particularly to a substrate processing apparatus and a method of operating a substrate processing apparatus which are useful for polishing a substrate, such as a semiconductor wafer, into a flat mirror surface.

2. Description of the Related Art

A substrate processing apparatus, such as a polishing apparatus, for polishing a surface of a semiconductor wafer into a flat mirror surface, is generally configured to sequentially feed substrates into the apparatus, successively carry out a series of processings for each substrate, and discharge the substrates after the processings out of the apparatus. It is common practice in such an apparatus to stop all the operations for substrates, such as semiconductor wafers, upon the occurrence of a serious failure in the apparatus, and to resume the operations after eliminating the cause of the apparatus failure. It is also common practice to continue sequential feeding of substrates into the apparatus and continue the series of processings for each substrate even upon the occurrence of an apparatus failure if the failure is minor enough to continue the operations of the apparatus.

SUMMARY OF THE INVENTION

The cost of one substrate, such as a semiconductor wafer, increases as the processing process for the substrate proceeds. When a failure occurs in a part of an apparatus, it sometimes takes one day to one week to eliminate the cause of the failure and repair the apparatus part. Thus, if all the operations for substrates are stopped upon the occurrence of such an apparatus failure and the substrates are left in the apparatus for such a long period of time, some substrates can become defective, e.g., due to corrosion, which may incur a significant loss.

A substrate processing apparatus is generally provided with a cleaning section for cleaning substrates while sequentially transferring the substrates. Substrates cannot be transferred in the cleaning section unless a stage (substrate transferring mechanism), provided in the cleaning section, for receiving and transporting substrate sequentially is in normal operation. Cleaning and recovery of substrates will become impossible also upon the occurrence of a failure in a cleaning device for performing a cleaning process. In such cases, it is necessary to take a substrate out of the cleaning section and to clean the substrate in a separate cleaning section. A door provided in a substrate processing apparatus, however, is generally designed to be not easy to open for safety reasons. Therefore, it is generally difficult to recover a substrate by taking the substrate out of a cleaning section, or to feed a recovered substrate into a cleaning section for cleaning of the substrate.

The present invention has been made in view of the above situation in the related art. It is therefore a first object of the present invention to provide a method for operating a substrate processing apparatus, which, upon the occurrence of a nonfatal failure in the apparatus, makes it possible to continue part of the apparatus operations for substrates to clean and recover a substrate or to easily discharge a substrate from the apparatus, without stopping an entire apparatus, thereby reducing the risk of a substrate becoming defective.

It is a second object of the present invention to provide a substrate processing apparatus which, upon the occurrence of an apparatus failure, enables a worker to safely and easily enter the apparatus to recover a substrate from the apparatus.

In order to achieve the first object, the present invention provides a method for operating a substrate processing apparatus having a polishing section, a cleaning section and a transferring mechanism. The method comprises classifying substrates, upon detection of a malfunction in any of the polishing section, the cleaning section and the transferring mechanism, according to the site of the malfunction and to the positions of the substrates in the substrate processing apparatus; and carrying out an operation for each of the substrates after the detection of the malfunction, the operation varying depending on the classification of the substrate.

According to this method, it becomes possible, upon detection of a malfunction in any of the polishing section, the cleaning section and the transferring mechanism, to continue part of the apparatus operations for substrates, for example, to clean and recover a substrate or to easily discharge a substrate out of the apparatus, without stopping an entire apparatus. This can decrease the number of defective substrates, thereby reducing the economic loss.

The operation for each substrate after the detection of the malfunction may be (i) an operation to proceed to processing or (ii) an operation to stop proceeding to processing for (1) the substrate before the processing, or (i) an operation to stop processing, (ii) an operation to continue processing, (iii) an operation to transfer the substrate to a processing section or the transferring mechanism, or (iv) an operation to clean the substrate in the cleaning section and then discharge the substrate from the substrate polishing apparatus for (2) the substrate in the processing.

The present invention provides another method for operating a substrate processing apparatus having a plurality of cleaning devices. The method comprises stopping cleaning in a cleaning devices upon detection of a malfunction in the cleaning device and, when a substrate is present in the cleaning device, taking the substrate out of the cleaning device; and cleaning a substrate in the other cleaning device (s) in normal operation, and discharging the substrate after cleaning from the substrate processing apparatus.

According to this method, when a failure has occurred in one of the plurality of cleaning devices, substrates can be sequentially transferred while skipping the faulty cleaning device, cleaned and dried in the other cleaning devices in normal operation, and recovered from the substrate processing apparatus.

The present invention provides yet another method for operating a substrate processing apparatus having a polishing section, a cleaning section and a transferring mechanism. The method comprises stopping an operation for a substrate upon detection of a malfunction in any of the polishing section, the cleaning section and the transferring mechanism; and discharging the substrate from the substrate processing apparatus, and cleaning the substrates in a cleaning section of another substrate processing apparatus in which the cleaning section is in normal operation.

According to this method, a substrate which, due to an apparatus failure, has been recovered, e.g., from the polishing section of the substrate processing apparatus without being cleaned in the cleaning section, can be cleaned and dried in another substrate processing apparatus in which a cleaning section is in normal operation.

The present invention provides yet another method for operating a substrate processing apparatus having a polishing section, a cleaning section and a transferring mechanism. The method comprises stopping transport of a substrate from the polishing section to the cleaning section in response to an interrupt processing signal, and carrying a substrate into the cleaning section from outside the substrate processing apparatus and cleaning the substrate in the cleaning section.

For example, when a failure has occurred in one of two substrate processing apparatuses and a number of substrates before cleaning have been recovered from the faulty substrate processing apparatus, the recovered substrates can be cleaned in a cleaning section of the other substrate processing apparatus in normal operation. This can satisfy the demand to clean the substrates as soon as possible.

In order to achieve the second object, the present invention provides an apparatus for processing a substrate comprises a first processing section for carrying out a first processing of a substrate, a second processing section for carrying out a second processing of the substrate, and a transferring mechanism for transporting the substrate. The substrate processing apparatus further comprises a door which is locked during normal operation of the apparatus and can be unlocked and opened after detection of the occurrence of a malfunction in the apparatus in order to recover the substrate, before or after the first processing, from the apparatus and feed the substrate into the apparatus for carrying out the second processing of the substrate.

The use of such a door can avoid the risk of a worker accidentally opening the doors during normal operation of the apparatus and, when safety is ensured after detection of a malfunction, can quickly open the doors and easily recover a substrate from the apparatus.

In a preferred aspect of the present invention, the door comprises a maintenance door or a substrate carry-in/carry-out door, and the substrate carry-in/carry-out door can be unlocked and opened in response to an interrupt processing signal even during normal operation of the apparatus.

Thus, by performing a predetermined operation, the substrate carry-in/carry-out door can be opened even during normal operation of the apparatus so as to carry a substrate into or out of the apparatus through the open door. This enables interrupt processing of a substrate, which has been carried in from outside the apparatus, e.g., by only using the second processing section.

The first processing section is, for example, a polishing section and the second processing section is, for example, a cleaning section. Preferably, the doors are locked/unlocked by electromagnetic locks.

According to the method for operating a substrate processing apparatus of the present invention, even when a failure has occurred in a part of the apparatus and it becomes impossible to continue a series of processings for a substrate, part of the apparatus operations for substrates can be continued and substrates can be quickly recovered without stopping the entire apparatus, thereby reducing the risk of a substrate becoming defective. According to the substrate processing apparatus of the present invention, the doors can be opened safely and quickly after detection of a malfunction, and a substrate can be easily recovered from the apparatus. The present invention thus makes it possible to decrease the number of defective products, thereby reducing the economic loss.

DETAILED DESCRIPTION OF THE PREFERRED EMBODIMENTS

Preferred embodiments of the present invention will now be described with reference to the drawings. The following description illustrates a polishing apparatus which is adapted to polish a surface of a substrate, such as a semiconductor wafer, into a flat mirror surface.

Figure 1:
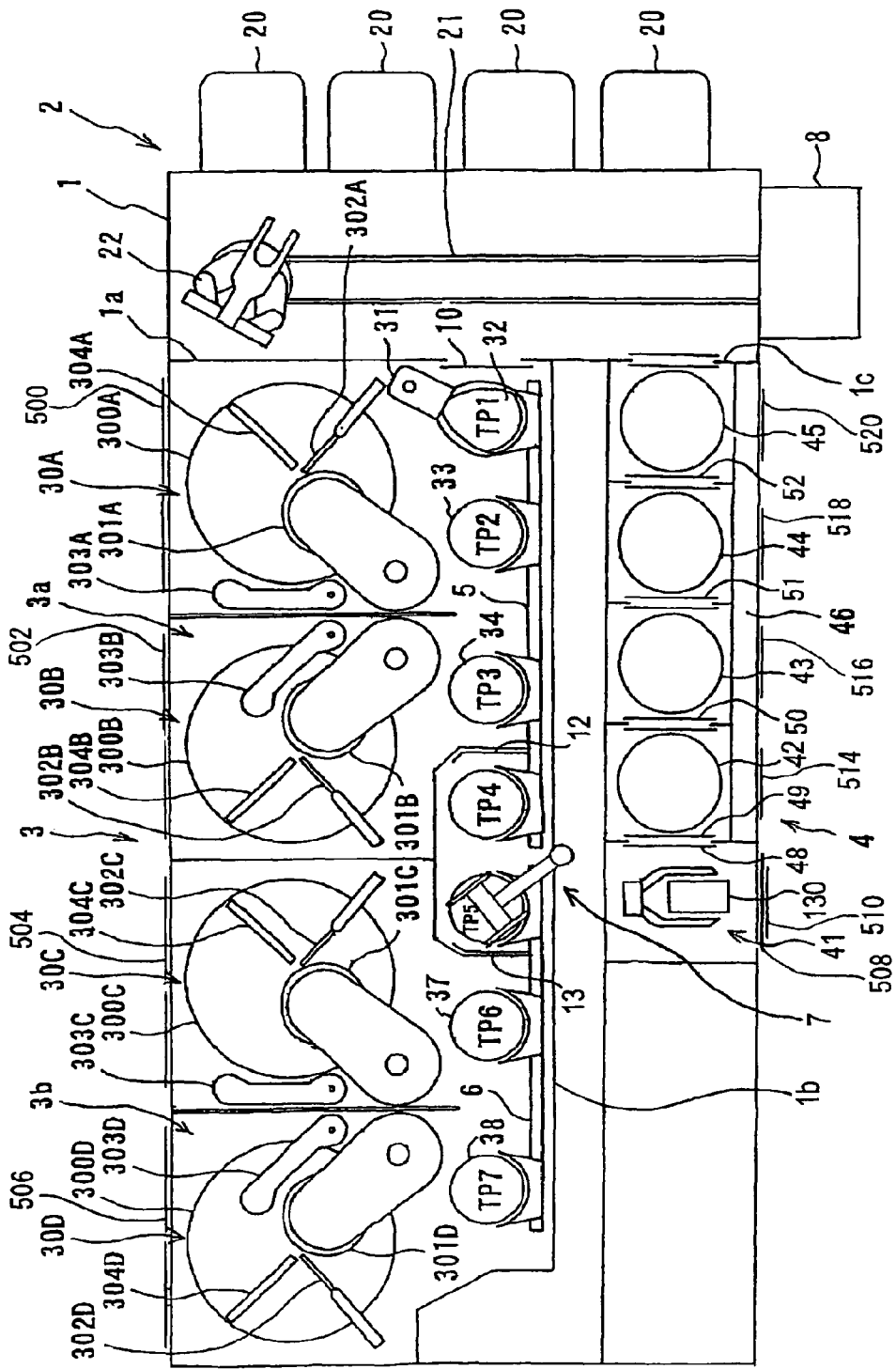
FIG. 1 is a plan view showing the overall construction of a substrate processing apparatus (polishing apparatus) according to an embodiment of the present invention.
Figure 2:
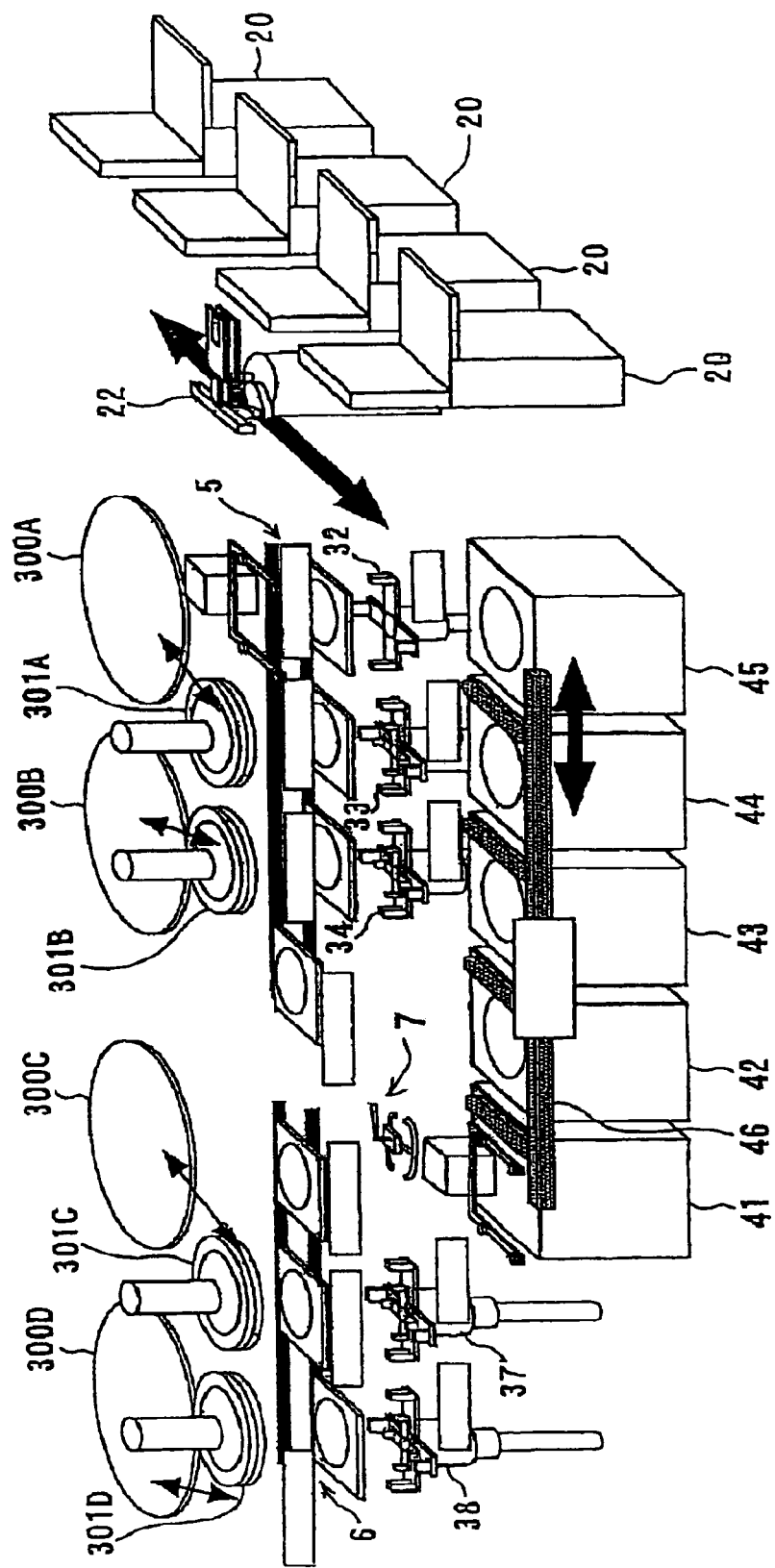
FIG. 2 is a schematic perspective view of the substrate processing apparatus shown in FIG. 1.

FIG. 1 is a plan view showing the overall construction of a polishing apparatus (substrate processing apparatus) according to an embodiment of the present invention, and FIG. 2 is a schematic perspective view of the polishing apparatus shown in FIG. 1. As shown in FIG. 1, the polishing apparatus of this embodiment has a housing 1 in a substantially rectangular form. An interior space of the housing 1 is divided into a loading/unloading section 2, a polishing section 3 (3a, 3b), and a cleaning section 4 by partition walls 1a, 1b and 1c. The loading/unloading section 2, the polishing section 3 (3a, 3b), and the cleaning section 4 are assembled independently of each other, and air is discharged from these sections independently of each other.

The loading/unloading section 2 has two or more front loading portions 20 (three in FIG. 1) on which substrate cassettes, each storing a number of substrates (semiconductor wafers), are placed. The front loading portions 20 are arranged adjacent to each other along a width direction of the polishing apparatus (a direction perpendicular to a longitudinal direction of the polishing apparatus). Each of the front loading portions 20 can receive thereon an open cassette, an SMIF (Standard Manufacturing Interface) pod, or a FOUP (Front Opening Unified Pod). The SMIF and FOUP are a hermetically sealed container which houses a substrate cassette therein and covers it with a partition wall to provide an interior environment isolated from an external space.

The loading/unloading section 2 has a moving mechanism 21 extending along an arrangement direction of the front loading portions 20. A transfer robot 22 is installed on the moving mechanism 21 and is movable along the arrangement direction of the front loading portions 20. The transfer robot 22 is operable to move on the moving mechanism 21 so as to access the substrates in the substrate cassettes mounted on the front loading portions 20. This transfer robot 22 has vertically arranged two hands, which are separately used. For example, an upper hand can be used for returning a polished substrate to the substrate cassette, and a lower hand can be used for transferring a non-polished substrate.

The loading/unloading section 2 is required to be a cleanest area. Therefore, pressure in the interior of the loading/unloading section 2 is kept higher at all times than pressures in the exterior space of the apparatus, the polishing section 3 and the cleaning section 4. Further, a filter fan unit (not shown in the drawings) having a clean air filter, such as HEPA filter or ULPA filter, is provided above the moving mechanism 21 of the transfer robot 22. This filter fan unit removes particles, toxic vapor, and toxic gas from air to produce clean air, and forms a downward flow of the clean air at all times.

The polishing section 3 is an area where a substrate is polished. The polishing section 3 includes a first polishing section 3a having a first polishing unit 30A and a second polishing unit 30B therein, and a second polishing section 3b having a third polishing unit 30C and a fourth polishing unit 30D therein. The first polishing unit 30A, the second polishing unit 30B, the third polishing unit 30C, and the fourth polishing unit 30D are arranged along the longitudinal direction of the polishing apparatus, as shown in FIG. 1.

As shown in FIG. 1, the first polishing unit 30A includes a polishing table 300A having a polishing surface, a top ring 301A for holding a substrate and pressing the substrate against the polishing table 300A so as to polish the substrate, a slurry supply nozzle 302A for supplying a slurry or a dressing liquid (e.g., pure water) onto the polishing table 300A, a dresser 303A for dressing the polishing table 300A, and an atomizer 304A having one or more nozzles for ejecting a mixture of a liquid (e.g., pure water) and a gas (e.g., nitrogen) in an atomized state to the polishing surface. Similarly, the second polishing unit 30B includes a polishing table 300B, a top ring 301B, a slurry supply nozzle 302B, a dresser 303B, and an atomizer 304B. The third polishing unit 30C includes a polishing table 300C, a top ring 301C, a slurry supply nozzle 302C, a dresser 303C, and an atomizer 304C. The fourth polishing unit 30D includes a polishing table 300D, a top ring 301D, a slurry supply nozzle 302D, a dresser 303D, and an atomizer 304D.

A first linear transporter 5 is provided between the first polishing unit 30A and the second polishing unit 30B in the first polishing section 3a and the cleaning section 4. This first linear transporter 5 is configured to transfer a substrate between four transferring positions located along the longitudinal direction of the polishing apparatus (hereinafter, these four transferring positions will be referred to as a first transferring position TP1, a second transferring position TP2, a third transferring position TP3, and a fourth transferring position TP4 in the order from the loading/unloading section 2). A reversing machine 31 for reversing a substrate transferred from the transfer robot 22 in the loading/unloading section 2 is disposed above the first transferring position TP1 of the first linear transporter 5. A vertically movable lifter 32 is disposed below the first transferring position TP1. A vertically movable pusher 33 is disposed below the second transferring position TP2, and a vertically movable pusher 34 is disposed below the third transferring position TP3. A shutter 12 is provided between the third transferring position TP3 and the fourth transferring position TP4.

In the second polishing section 3b, a second linear transporter 6 is provided next to the first linear transporter 5. This second linear transporter 6 is configured to transfer a substrate between three transferring positions located along the longitudinal direction of the polishing apparatus (hereinafter, these three transferring positions will be referred to as a fifth transferring position TP5, a sixth transferring position TP6, and a seventh transferring position TP7 in the order from the loading/unloading section 2). A pusher 37 is disposed below the sixth transferring position TP6 of the second linear transporter 6, and a pusher 38 is disposed below the seventh transferring position TP7. A shutter 13 is provided between the fifth transferring position TP5 and the sixth transferring position TP6.

As can be understood from the fact that an abrasive liquid (slurry) is used during polishing, the polishing section 3 is the dirtiest area. Therefore, in order to prevent particles from spreading out of the polishing section 3, a gas is discharged from surrounding spaces of the respective polishing tables in this embodiment. In addition, pressure in the interior of the polishing section 3 is set to be lower than pressures in the exterior of the apparatus, the cleaning section 4, and the loading/unloading section 2, whereby scattering of particles is prevented. Typically, discharge ducts (not shown in the drawings) are provided below the polishing tables, respectively, and filters (not shown in the drawings) are provided above the polishing tables, so that downward flows of clean air are formed from the filters to the discharge ducts.

The polishing units 30A, 30B, 30C and 30D are each partitioned and closed by a partition wall, and the air is exhausted individually from each of the closed polishing units 30A, 30B, 30C and 30D. Thus, a substrate can be processed in the closed polishing unit 30A, 30B, 30C or 30D without being influenced by the atmosphere of a slurry. This enables good polishing of the substrate. As shown in FIG. 1, the partition walls between the polishing units 30A, 30B, 30C and 30D each have an opening for passage of the linear transporters 5, 6. It is also possible to provide each opening with a shutter, and to open the shutter only when a substrate passes through the opening.

The cleaning section 4 is an area where a polished substrate is cleaned. The cleaning section 4 includes a reversing machine 41 for reversing a substrate, four cleaning devices 42-45 for cleaning a polished substrate, and a transfer unit 46 for transferring a substrate between the reversing machine 41 and the cleaning devices 42-45. The reversing machine 41 and the cleaning devices 42-45 are arranged in series along the longitudinal direction of the polishing apparatus. A filter fan unit (not shown in the drawings), having a clean air filter, is provided above the cleaning devices 42-45. This filter fan unit is configured to remove particles from an air to produce a clean air, and to form downward flow of the clean air at all times. Pressure in the interior of the cleaning section 4 is kept higher than pressure in the polishing section 3, so that particles in the polishing section 3 is prevented from flowing into the cleaning section 4.

As shown in FIG. 1, between the first linear transporter 5 and the second linear transporter 6 is disposed a swing transporter (substrate transferring mechanism) 7 for transporting a substrate between the first linear transporter 5, the second linear transporter 6 and the reversing machine 41 of the cleaning section 4. The swing transporter 7 can transfer the substrate from the fourth transferring position TP4 of the first linear transporter 5 to the fifth transferring position TP5 of the second linear transporter 6, from the fifth transferring position TP5 of the second linear transporter 6 to the reversing machine 41, and from the fourth transferring position TP4 of the first linear transporter 5 to the reversing machine 41.

A Shutter (not shown), which is vertically driven by a cylinder, is provided between the apparatus and the openings of the substrate cassettes mounted on the front loading portions 20. The shutter is closed except when the transfer robot 22 carries a substrate into or out of the substrate cassettes.

As shown in FIG. 1, a film thickness measuring device [ITM (in-line thickness monitor)] 8 for measuring a thickness of a film of a substrate is provided beside the loading/unloading section 2. The transfer robot 22 can reach the film thickness measuring device 8. The film thickness measuring device 8 receives a substrate before or after polishing from the transfer robot 22, and measures a thickness of a film of the substrate. Polishing accuracy can be enhanced by appropriately adjusting the polishing conditions and the like based on the results of measurement with the film thickness measuring device 8.

The polishing units 30A, 30B, 30C and 30D in the polishing section 3 will be described below. These polishing units 30A, 30B, 30C and 30D have substantially the same structure, and only the first polishing unit 30A will be described below.

The polishing table 300A has a polishing cloth or a grinding stone attached thereon, and the polishing pad or the grinding stone forms a polishing surface to polish a substrate. At the time of polishing, a slurry is supplied onto the polishing surface of the polishing table 300A from the slurry supply nozzle 302A. A substrate to be polished is pressed against the polishing surface by the top ring 301A to perform polishing.

One or more polishing units may have a polishing surface in the form of a belt or a tape, and a polishing surface in the form of a belt or a tape may be combined with a polishing surface in the form of a table.

The top ring 301A attracts by vacuum suction a substrate W, which has been transported to the pusher 33, and holds the substrate. The top ring 301A then is swung from the position above the pusher 33 to the position above the polishing surface of the polishing table 300A. After the top ring 301 is moved to the position above the polishing table 300A, where the top ring 301A can polish the substrate, the top ring 301A is rotated at a predetermined rotational speed and then lowered to an upper surface of the polishing table 300A. When the top ring 301A comes into contact with the upper surface of the polishing table 300A, the top ring 301A is pressed against the polishing table 300A to apply a pressing force to the substrate. At the same time, a slurry is applied from the slurry supply nozzle 302A onto the upper surface of the polishing table 300A thereby polishing a surface of the substrate.

When polishing is completed, the top ring 301A is lifted. Thereafter, the top ring 301A starts a swinging motion, moves to a position above the pusher 33, and transfers the substrate to the pusher 33. After the substrate is transferred to the pusher 33, a cleaning liquid is ejected downwardly, horizontally, or upwardly toward the top ring 301A to clean the substrate holding surface of the top ring 301A, the polished substrate, and surrounding regions.

The swing transporter 7 is disposed on a frame of a case of the first polishing section 3a, and has a substrate gripping mechanism for gripping and transferring a substrate between the first liner transporter 5, the second transporter 6, and the cleaning section 4.

As shown in FIG. 2, the first linear transporter 5 in the first polishing section 3a has four transfer stages: TS1 (first stage), TS2 (second stage), TS3 (third stage), and TS4 (fourth stage), which are linearly movable in a reciprocating manner. These transfer stages have a two-line structure including an upper line and a lower line. Specifically, the first transfer stage TS1, the second transfer stage TS2, and the third transfer stage TS3 are disposed on the lower line, and the fourth transfer stage TS4 is disposed on the upper line.

The lower transfer stages TS1, TS2 and TS3 and the upper transfer stage TS4 can freely move without interfering with each other, because they are provided at different heights. The first transfer stage TS1 transfers a substrate between the first transferring position TP1, at which the reversing machine 31 and the lifter 32 are disposed, and the second transferring position TP2, which is a substrate receiving/delivering position at which the pusher 33 is disposed. The second transfer stage TS2 transfers a substrate between the second transferring position TP2 and the third transferring position TP3, which is a substrate receiving/delivering position at which the pusher 34 is disposed. The third transfer stage TS3 transfers a substrate between the third transferring position TP3 and the fourth transferring position TP4. The fourth transfer stage TS4 transfers substrate between the first transferring position TP1 and the fourth transferring position TP4.

The first linear transporter 5 is provided with an air cylinder (not shown) for linearly reciprocating the upper-level fourth transport stage TS4. The fourth transport stage TS4 is controlled such that it is moved by the air cylinder simultaneously with and in a direction opposite to the movement of the lower-level transport stages TS1, TS2 and TS3. The shutter 12 is opened only when the third transport stage TS3 or the fourth transport stage TS4 is moved from or to the fourth transport position TP4. This can minimize air flow flowing from the highly contaminated polishing section 3a into the cleaning section 4 of high cleanness, thereby preventing contamination of a substrate in the cleaning section 4 and hence increasing the throughput as compared to a conventional polishing apparatus.

As shown in FIG. 2, the second linear transporter 6 in the second polishing section 6 has three transfer stages: TS5 (fifth stage), TS6 (sixth stage) and TS7 (seventh stage), which are linearly movable in a reciprocating manner. These transfer stages have a two-line structure including an upper line and a lower line. Specifically, a fifth transfer stage TS5 and a sixth transfer stage TS6 are disposed on an upper line, whereas a seventh transfer stage TS7 is disposed on a lower line.

The upper transfer stages TS5, TS6 and the lower transfer stage TS7 can freely move without interfering with each other, because they are provided at different heights. The fifth transfer stage TS5 transfers a substrate between the fifth transferring position TP5 and the sixth transferring position TP6, which is a substrate receiving/delivering position at which the pusher 37 is disposed. The sixth transfer stage TS6 transfers a substrate between the sixth transferring position TP6 and the seventh transferring position TP7, which is a substrate receiving/delivering position at which the pusher 38 is disposed. The seventh transfer stage TS7 transfers a substrate between the fifth transferring position TP5 and the seventh transferring position TP7.

The reversing machine 31 in the first polishing section 3a is disposed at a position to which a hand of the transfer robot 22 in the loading/unloading section 2 is accessible and serves to receive a substrate that has not been polished from the transfer robot 22, reverse the substrate upside down, and deliver the substrate to the lifter 32.

As shown in FIG. 1, a shutter 10 is provided between the reversing machine 31 and the transfer robot 22. When transferring a substrate, the shutter 10 is opened, and the substrate is delivered between the transfer robot 22 and the reversing machine 31. When a substrate is not transferred, the shutter 10 is closed. The shutter 10 has a waterproof mechanism so as to clean the substrate or clean the hands of the transfer robot 22. A plurality of nozzles (not shown) may be provided around the reversing machine 31 for preventing a substrate from being dried. If a substrate remains for a long period of time, then pure water is ejected from the nozzles to prevent the substrate from being dried.

The reversing machine 41 of the cleaning section 4 is disposed at a position reachable by the grip portion of the swing transporter 7. The reversing machine 41 receives a substrate after polishing from the grip portion of the swing transporter 7, reverses the substrate upside down, and transfers the substrate to the transfer unit 46. The reversing machine 41 has basically the same construction as the above-described reversing machine 31 of the first polishing section 3a. The reversing machine 91, operating in the same manner as the reversing machine 31, receives a substrate after polishing from the swing transporter 7, reverses the substrate upside down, and transfers the substrate to the transfer unit 46.

The lifter 32 in the first polishing section 3a is disposed at a position to which the transfer robot 22 and the first linear transporter 5 are accessible, and serves as a receiving/delivering mechanism for receiving and delivering a substrate between the transfer robot 22 and the first linear transporter 5. Specifically, the lifter 32 serves to deliver a substrate reversed by the reversing machine 31 to the first transfer stage TS1 or the fourth transfer stage TS4 in the first linear transporter 5.

A substrate to be polished is transferred from the transfer robot 22 to the reversing machine 31. Then, the substrate is reversed so that a pattern surface of the substrate faces downward. The lifter 32 is raised toward the substrate held by the reversing machine 31 and is stopped right below the substrate. When the sensor for detecting lifting of the lifter detects the stop of the lifter 32 at a position where the stage 322 is located right below the substrate, the reversing machine 31 releases the substrate by opening the clamps and the substrate is placed on the stage of the lifter 32. Thereafter, the lifter 32 is lowered while holding the substrate thereon. While the substrate is lowered, the substrate is transferred to the transfer stage TS1 or TS4 of the first linear transporter 5. After the substrate is transferred to the first linear transporter 5, the lifter 32 continues to be lowered, and then is stopped when the lifter 32 is lowered to the predetermined position.

The pusher 33 in the first polishing section 3a serves to receive a substrate from the transfer stage TS1 of the first linear transporter 5 and deliver the substrate to the top ring 301A of the first polishing unit 30A, and also serves to receive a polished substrate from the first polishing unit 30A and deliver the substrate to the transfer stage TS2 of the first linear transporter 5. The pusher 34 in the first polishing section 3a serves to receive a substrate from the transfer stage TS2 of the first linear transporter 5 and deliver the substrate to the top ring 301B of the second polishing unit 30B, and also serves to receive a polished substrate from the second polishing unit 30B and deliver the substrate to the transfer stage TS3 of the first linear transporter 5. The pusher 37 in the second polishing section 3b serves to receive a substrate from the transfer stage TS5 of the second linear transporter 6 and deliver the substrate to the top ring 301C of the third polishing unit 30C, and also serves to receive a polished substrate from the third polishing unit 30C and deliver the substrate to the transfer stage TS6 of the second linear transporter 6. The pusher 38 serves to receive a substrate from the transfer stage TS6 of the second linear transporter 6 and deliver the substrate to the top ring 301D of the fourth polishing unit 30D, and also serves to receive a polished substrate from the fourth polishing unit 30D and deliver the substrate to the transfer stage TS7 of the second linear transporter 6. Thus, the pushers 33, 34, 37 and 38 serve as a receiving/delivering mechanism for receiving and delivering substrates between the linear transporters 5, 6 and the respective top rings. These pushers 33, 34, 37 and 38 have the same structure.

Figure 3:
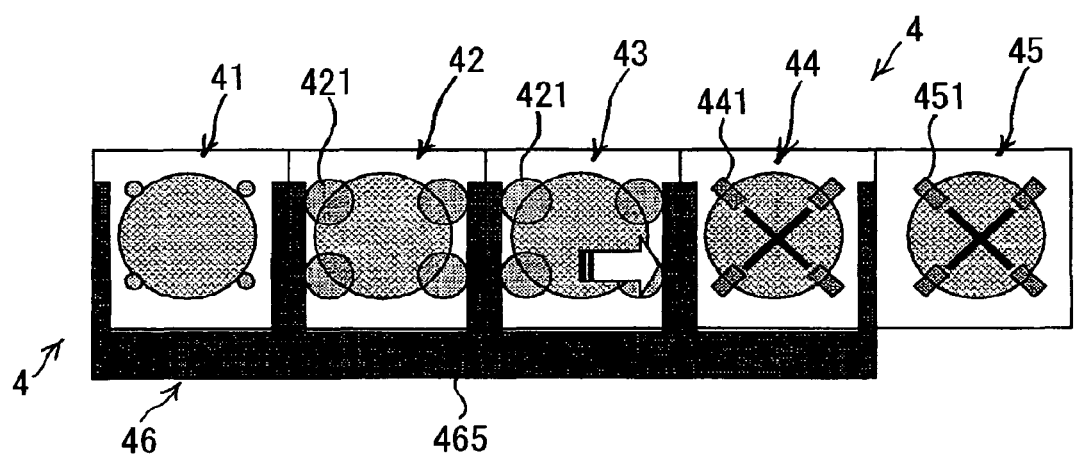
FIG. 3 is a schematic plan view of a cleaning section of the substrate processing apparatus shown in FIG. 1.

In this embodiment, as shown in FIG. 3, the primary cleaning device 42 and the secondary cleaning device 43 of the cleaning section 4 are each a roll-type cleaning device which has a plurality of rollers 421 and cleans front and back surfaces of a substrate by pressing upper and lower rotating roll-shaped sponges against the front and back surfaces of the substrate. The tertiary cleaning device 44 is a pencil-type cleaning device which has a substrate stage 441 and cleans a front surface of a substrate by pressing a rotating hemispherical sponge (not shown) against the surface of the substrate. The quaternary cleaning device 45 is a pencil-type cleaning device which cleans a front surface of a substrate by pressing a rotating hemispherical sponge against the surface of the substrate and which can rinse the back surface of the substrate. The quaternary cleaning device 45 has a substrate stage 451 for rotating a chucked substrate at a high speed, and thus has the function (spin-drying function) of drying a substrate after cleaning by rotating it at a high speed. It is possible to additionally provide in any of the cleaning devices 42-45 a megasonic-type cleaning device, which carries out cleaning by applying ultrasonic waves to a cleaning liquid, in addition to the above-described roll-type cleaning device or pencil-type cleaning device.

Figure 4:
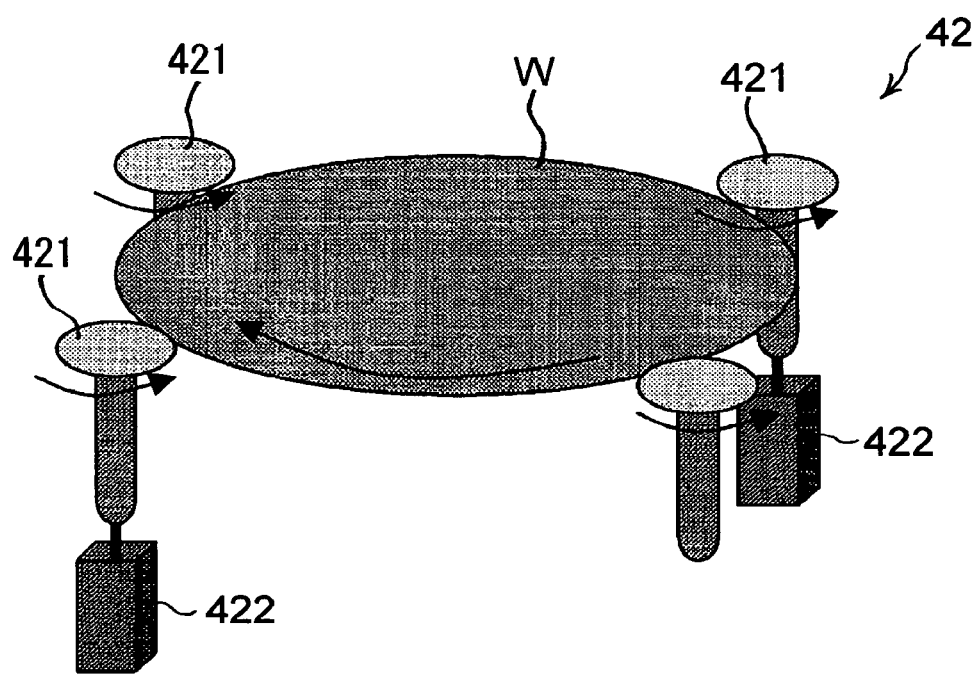
FIG. 4 is a schematic perspective view of a primary cleaning device provided in the cleaning section shown in FIG. 3.

As shown in FIG. 4, the primary cleaning device 42 of this embodiment has four openable/closable rollers 421, and servomotors 422 are coupled to the lower ends of two of the four rollers 421. When the rollers 421 are moved toward a substrate W and closed, the periphery of the substrate W is held by the rollers 421. The rollers 421 are then rotated by the servomotors 422 to rotate the substrate W.

Figure 5:
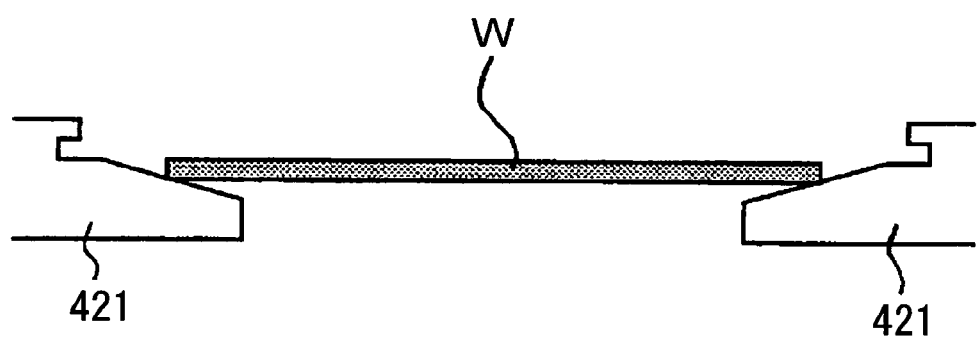
FIG. 5 is a cross-sectional diagram showing the relationship between a substrate and rollers in the primary cleaning device of the cleaning section shown in FIG. 3.
Figure 6:
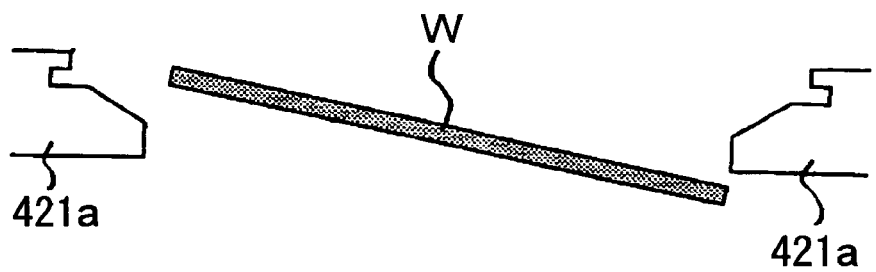
FIG. 6 is a cross-sectional diagram showing the relationship between a substrate and rollers in a conventional cleaning device.

In this embodiment, as shown in FIG. 5, the rollers 421 each have such a size (diameter) that a substrate W can be held on the upper surfaces of the rollers 421 when the rollers 421 are in retreat positions (open positions). It is noted in this regard that in a conventional common roll-type cleaning device, its rollers 921a each have such a size (diameter) that a substrate W cannot be held on the upper surfaces of the rollers 421a when the rollers 421a are in retreat positions (open positions), as shown in FIG. 6. When the cleaning operation of such a conventional cleaning device is stopped due to a failure of the cleaning device, a substrate cannot be transferred to the downstream side of the cleaning device. According to this embodiment, on the other hand, when the cleaning operation of the primary cleaning device 42 is stopped due to a failure of the primary cleaning device 42, a substrate can be held on the upper surfaces of the rollers 421 of the primary cleaning device 42 and can then be transferred to the downstream side of the primary cleaning device 42. The same holds true for the secondary cleaning device 43.

With reference to the pencil-type tertiary cleaning device 44, even when the cleaning operation of the tertiary cleaning device 44 is stopped due to a failure of the tertiary cleaning device 44, a substrate can be held on the substrate stage 441 and can then be transferred to the downstream side of the tertiary cleaning device 44. The sane holds true for the quaternary cleaning device 45.

Figure 7:
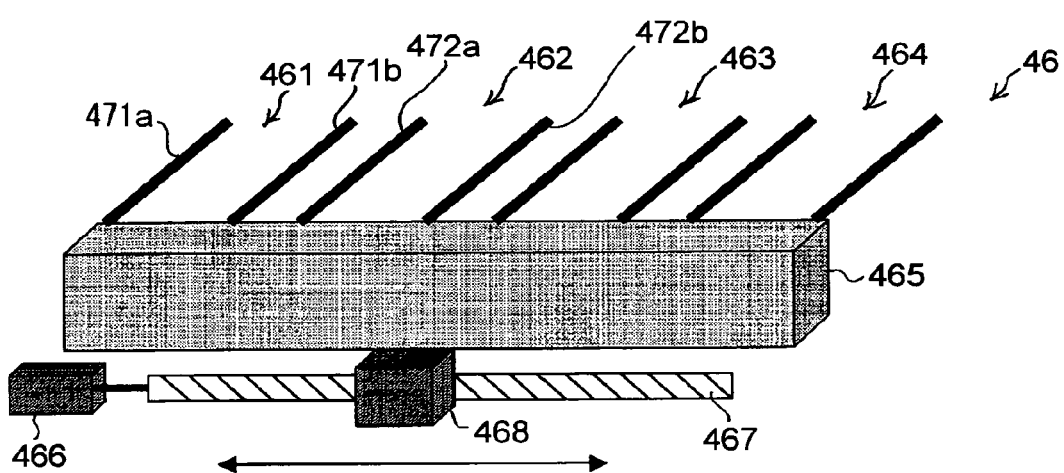
FIG. 7 is a schematic perspective view of a transfer unit provided in the cleaning section shown in FIG. 3.

As shown in FIG. 7, the transfer unit 46 of the cleaning section 4 includes four chucking units 461-464 as a substrate gripping mechanism for detachably gripping a substrate in a cleaning device. The chucking unit 461 is comprised of a pair of openable/closable arms 471a, 471b for holding a substrate W, and the chucking unit 462 is comprised of a pair of arms 472a, 472b. The base ends of the pair of arms 471a, 471b of the chucking unit 461 and the base ends of the pair of arms 472a, 472b of the chucking unit 462 are mounted to a main frame 465 slidably in opposite directions. The chucking units 463, 464 have basically the same construction as the chucking units 461, 462.

Below the main frame 465 is disposed a ball screw 467 which extends parallel to the alignment of the cleaning devices 42-45 and is coupled, at its one end, to a servomotor 466. The main frame 465 is fixed on a block 468 having therein a female thread in engagement with the ball screw 467. With this structure, when the servomotor 466 is driven, the main frame 465 and the chucking units 461-464 move horizontally. Thus, the servomotor 466 and the ball screw 467 constitute a movement mechanism for moving the chucking units 461-464 along the alignment direction of the cleaning devices 42-45 (alignment direction of the chucking units 461-464).

As shown in FIG. 1, the reversing machine 41 and the cleaning devices 42-45 are housed in their respective chambers, partitioned by openable/closable shutters 48, 49, 50, 51 and 52 which block a scattered fluid during cleaning.

In this embodiment, the transfer unit 46 can simultaneously transfer substrates from the reversing machine 41 to the primary cleaning device 42, from the primary cleaning device 42 to the secondary cleaning device 43, from the secondary cleaning device 43 to the tertiary cleaning device 44, and from the tertiary cleaning device 44 to the quaternary cleaning device 45. Further, a substrate can be transferred to the next cleaning device by moving the substrate in the alignment direction of the cleaning devices. This can minimize the stroke of substrate transfer and shorten time for substrate transfer.

As shown in FIG. 1, an openable/closable maintenance door 500, which is locked during normal operation and can be unlocked after detection of a malfunction, is provided in the exterior wall of the chamber housing the polishing unit 30A therein. This maintenance door 500 can be opened and closed safely and easily by an electromagnetic lock for which a locking/unlocking operation is performed on the screen of an operation panel. Similarly, an openable/closable maintenance door 502 is provided in the exterior wall of the chamber housing the polishing unit 30B therein, an openable/closable maintenance door 504 is provided in the exterior wall of the chamber housing the polishing unit 30C therein, and an openable/closable maintenance door 506 is provided in the exterior wall of the chamber housing the polishing unit 30D therein.

Also in the exterior wall of the chamber housing the reversing machine 41 therein is provided with an openable/closable maintenance door 508 which is locked during normal operation and can be unlocked after detection of a malfunction so that a worker can enter the chamber. The maintenance door 508 also can be opened and closed safely and easily by an electromagnetic lock for which a locking/unlocking operation is performed on the screen of the operation panel.

Figure 8:
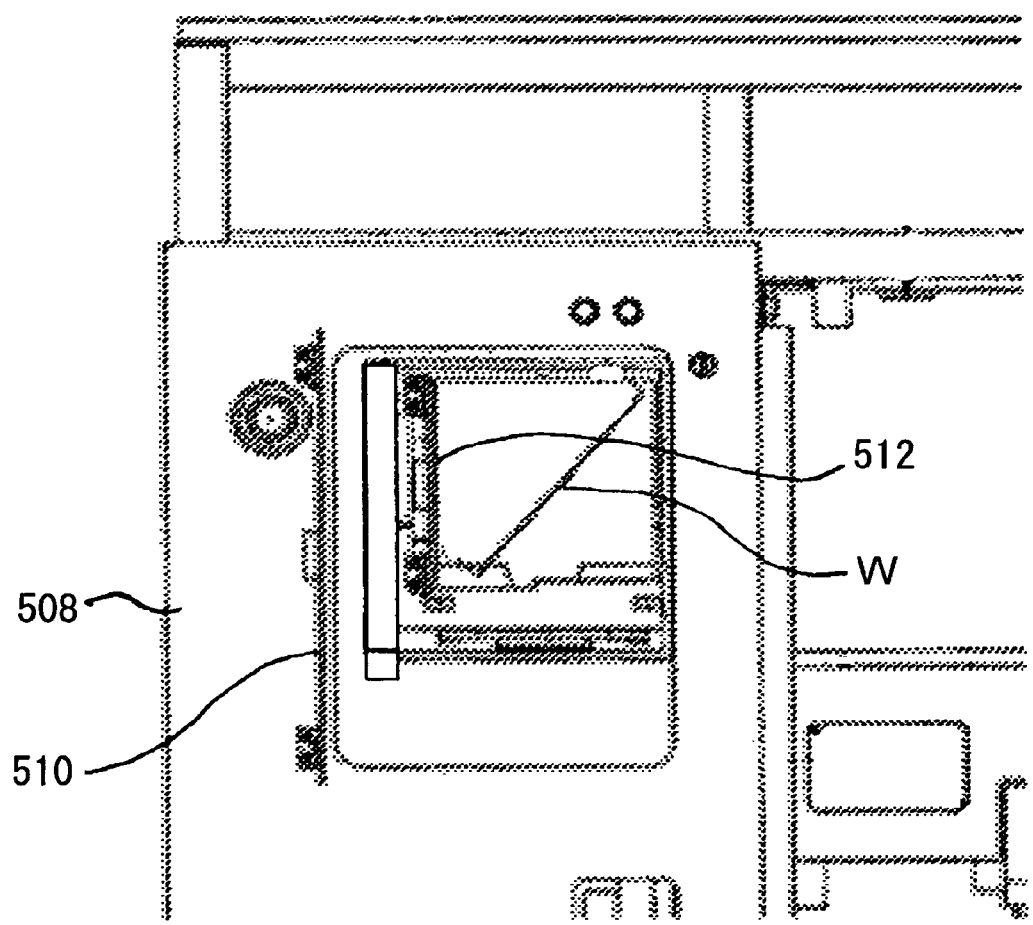
FIG. 8 is a front view of a maintenance door in front of a reversing machine provided in the cleaning section.
Figure 9:
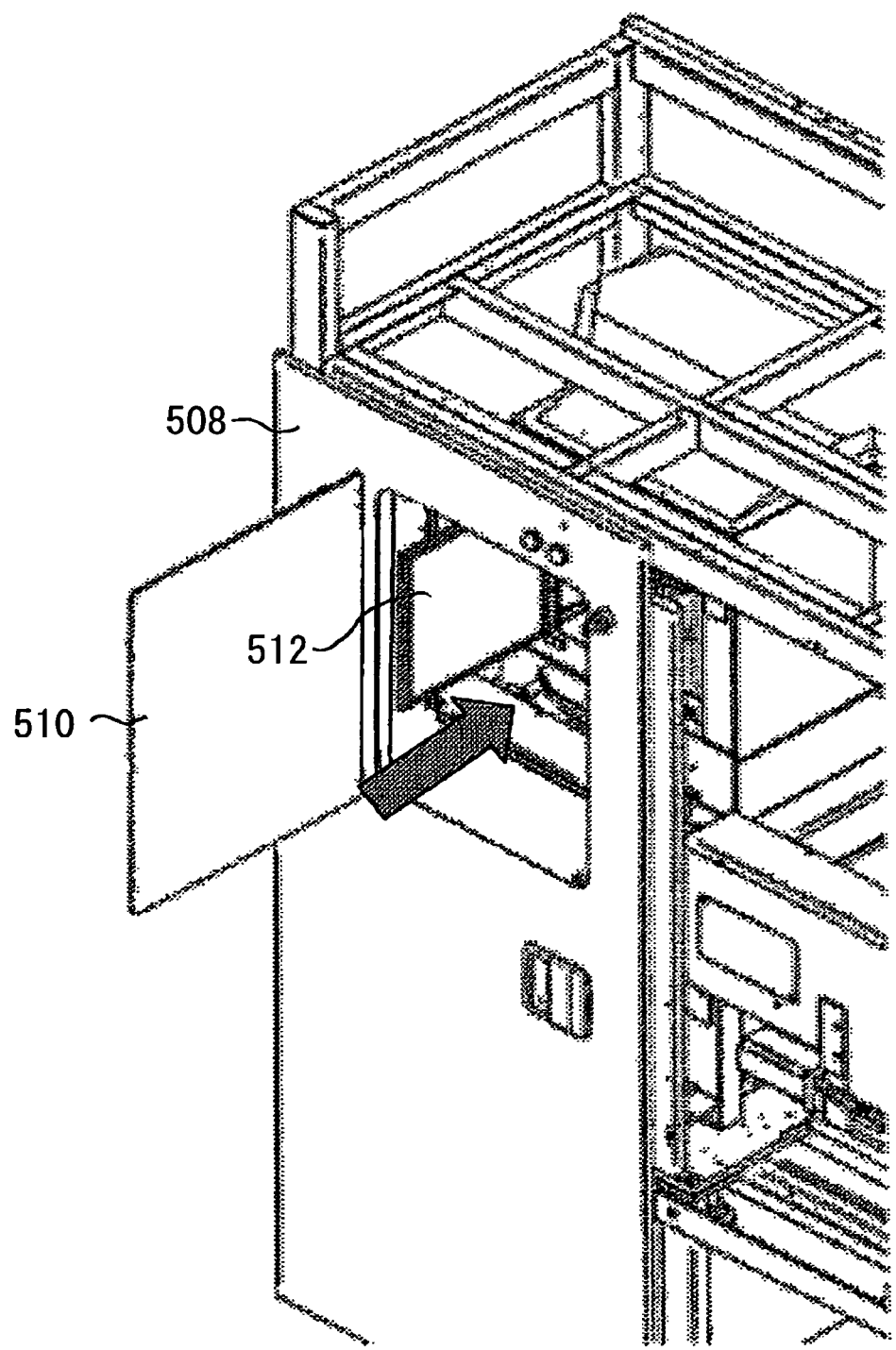
FIG. 9 is a perspective view of the maintenance door in front of the reversing machine provided in the cleaning section.

As shown in FIGS. 8 and 9, the maintenance door 508, provided in the exterior wall of the chamber housing the reversing machine 41 therein, is provided with an openable/closable substrate carry-in/carry-out door 510 so that a substrate can be carried in and out by hand without opening the maintenance door 508. As with the above-described maintenance doors, the substrate carry-in/carry-out door 510 can be unlocked after detection of a malfunction, and can be opened and closed safely and easily by an electromagnetic lock for which a locking/unlocking operation is performed on the screen of the operation panel. Further, an openable/closable reversing machine door 512 is provided between the substrate carry-in/carry-out door 510 and the reversing machine 41. By opening the substrate carry-in/carry-out door 510 and the reversing machine door 512, a substrate W can be fed by hand to the upper surface of the reversing machine 41, or a substrate W on the reversing machine 41 can be taken by hand out of the apparatus, without opening the maintenance door 508, as shown in FIG. 8.

The substrate carry-in/carry-out door 510 can be unlocked and opened in response to an interrupt processing signal even during normal operation, and can be opened and closed safely and easily by an electromagnetic lock for which a locking/unlocking operation is performed on the screen of the operation panel.

As shown in FIG. 1, an openable/closable substrate carry-in/carry-out door 514, having approximately the same size as the substrate carry-in/carry-out door 510, is provided in the exterior wall of the chamber housing therein the primary cleaning device 42 of the cleaning section 4 of the polishing apparatus. The substrate carry-in/carry-out door 514 can be unlocked after detection of a malfunction or in response to an interrupt processing signal, and can be opened and closed safely and easily by an electromagnetic lock for which a locking/unlocking operation is performed on the screen of the operation panel. Similarly, a substrate carry-in/carry-out door 516 is provided in the exterior wall of the chamber housing therein the secondary cleaning device 43, a substrate carry-in/carry-out door 518 is provided in the exterior wall of the chamber housing therein the tertiary cleaning device 44, and a substrate carry-in/carry-out door 520 is provided in the exterior wall of the chamber housing therein the quaternary cleaning device 45.

A substrate in any of the cleaning devices 42-45 can be taken by hand out of the apparatus by opening the substrate carry-in/carry-out doors 514, 516, 518 or 520 by performing an unlocking operation on the screen of the operation panel after detection of a malfunction or in response to an interrupt processing signal.

This polishing apparatus performs parallel processing of substrates. When parallel processing of a substrate is performed, the substrate is transferred on the following route: the substrate cassette of the front loading portion 20→the transfer robot 22→the reversing machine 31→the lifter 32→the first transfer stage TS1 of the first linear transporter 5→the pusher 33→the top ring 301A→the polishing table 300A→the pusher 33→the second transfer stage TS2 of the first linear transporter 5→the pusher 34→the top ring 301B→the polishing table 300B→the pusher 34→the third transfer stage TS3 of the first linear transporter 5→the swing transporter 7→the reversing machine 41→a temporary placing place 130→the chucking unit 461 of the transfer unit 46→the primary cleaning device 42→the chucking unit 462 of the transfer unit 46→the secondary cleaning device 43→the chucking unit 463 of the transfer unit 46→the tertiary cleaning device 44→the chucking unit 464 of the transfer unit 46→the quaternary cleaning device 45→the transfer robot 22→the substrate cassette of the front loading portion 20.

Another substrate is transferred on the following route: the substrate cassette of the front loading portion 20→the transfer robot 22→the reversing machine 31→the lifter 32→the fourth transfer stage TS4 of the first linear transporter 5→the swing transporter 7→the fifth transfer stage TS5 of the second linear transporter 6→pusher 37→the top ring 301C→the polishing table 300C→the pusher 37→the sixth transfer stage TS6 of the second linear transporter 6→the pusher 38→the top ring 301D→the polishing table 300D→the pusher 38→the seventh transfer stage TS7 of the second linear transporter 6→the swing transporter 7→the reversing machine 41→the temporary placing place 130→the chucking unit 461 of the transfer unit 46→the primary cleaning device 42→the chucking unit 462 of the transfer unit 46→the secondary cleaning device 43→the chucking unit 463 of the transfer unit 46→the tertiary cleaning device 44→the chucking unit 464 of the transfer unit 46→the quaternary cleaning device 45→the transfer robot 22→the substrate cassette of the front loading portion 20.

In the polishing apparatus, sensors are provided in devices in order to precisely determine whether the apparatus must be stopped due to a failure which has occurred in the apparatus. In particular, the degree or grade of a failure is determined so as not to stop the apparatus unless the degree of the failure is such as to affect the safe operation of the apparatus. Further, by determining the degree or grade of a failure by using the sensors, it becomes possible to stop feeding of substrates into the apparatus early before the apparatus comes to a stop, thereby preventing substrates from becoming defective.

Figure 10:
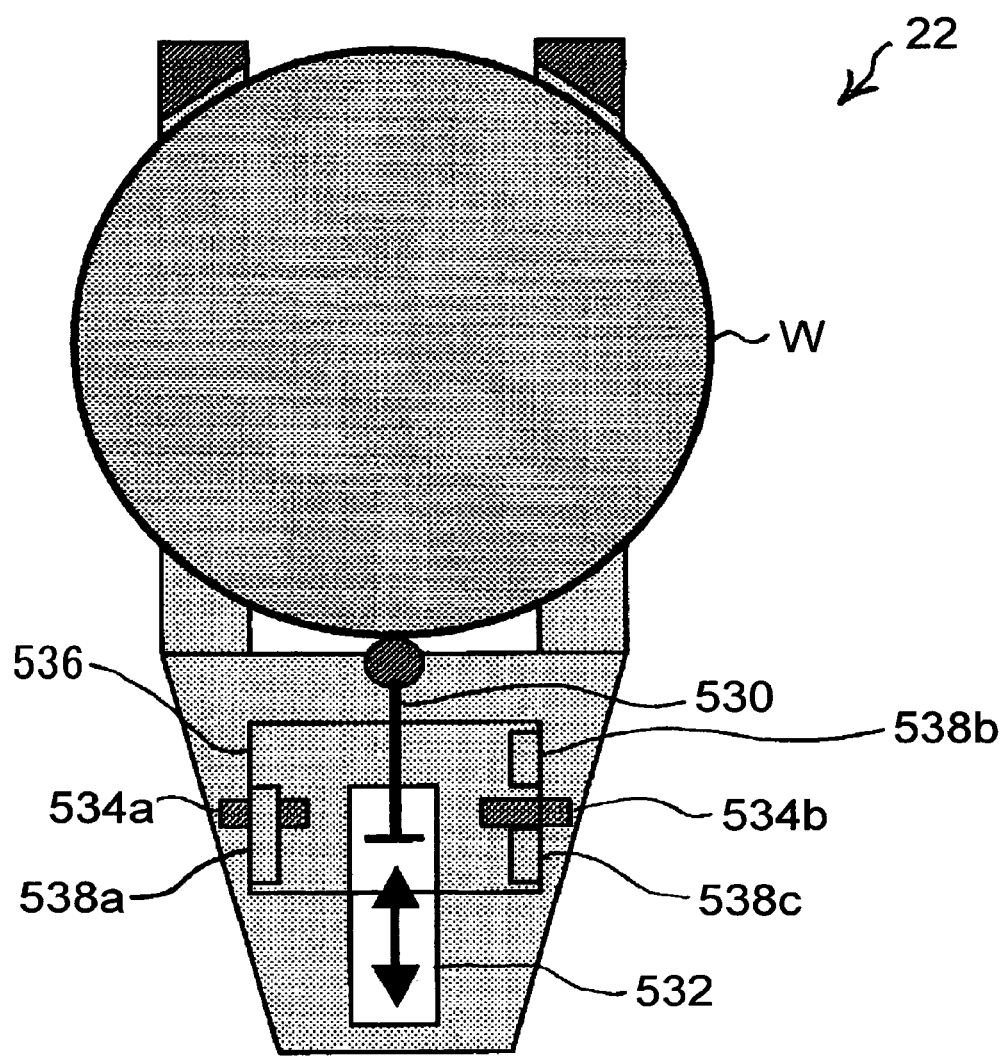
FIG. 10 is a schematic plan view showing a transfer robot, provided in a loading/unloading section of the substrate processing apparatus, together with sensors.
Figure 11:
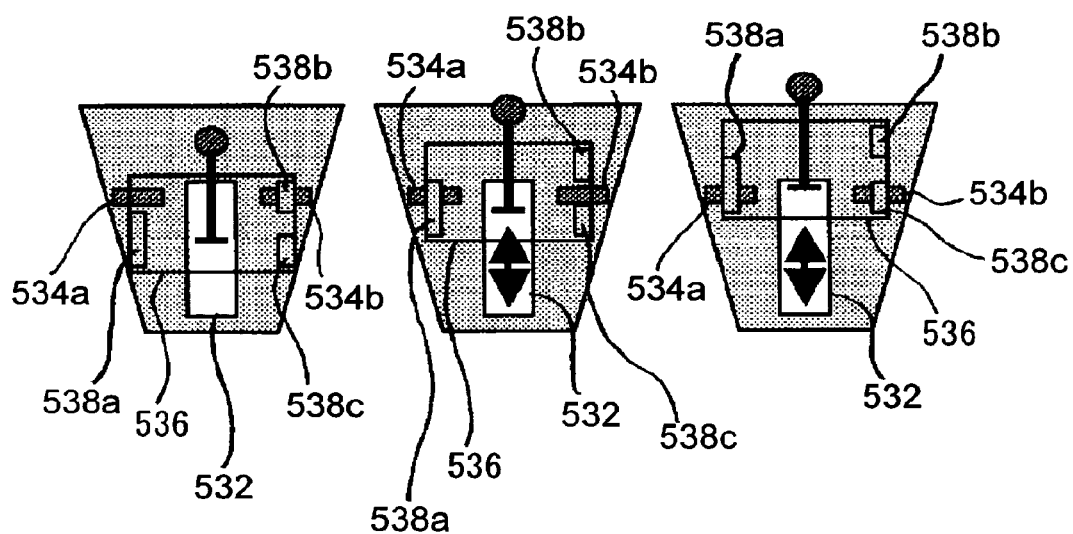
FIGS. 11A through 11C are diagrams showing relationships between sensors and a sensor jig, provided in the transfer robot shown in FIG. 10, FIG. 11A illustrating the relationship upon release of holding of a substrate by the transfer robot, FIG. 11B illustrating the relationship upon holding of a substrate by the transfer robot and FIG. 11C illustrating the relationship upon failure of holding of a substrate.

In the transfer robot 22, as shown in FIG. 10, for example, a first photo micro sensor 534a and a second photo micro sensor 534b are disposed on both sides of an air cylinder 532 for elongating and contracting a rod 530 that is to hold a substrate W. When a sensor jig 536, having a light-blocking portion 538a and light-blocking portions 538b, 538c spaced apart at a distance, moves together with the rod 530 in conjunction with the air cylinder 532, the light-blocking portion 538a passes through the interior of the first photo micro sensor 534a and the light-blocking portions 538b, 538c pass through the interior of the second photo micro sensor 534b. Release of holding of the substrate W is detected when the first photo micro sensor 534a is not blocked by the light-blocking portion 538a of the sensor jig 536 and the second photo micro sensor 534b is blocked by the light-blocking portion 538b of the sensor jig 536, as shown in FIG. 11A. Holding of the substrate W is detected when the first photo micro sensor 534a is blocked by the light-blocking portion 538a of the sensor jig 536 and the second photo micro sensor 534b is not blocked by the light-blocking portions 538b, 538c of the sensor jig 536, as shown in FIG. 11B. Further, a substrate holding error is detected when the first photo micro sensor 534a is blocked by the light-blocking portion 538a of the sensor jig 536 and the second photo micro sensor 534b is blocked by the light-blocking portion 538c of the sensor jig 536, as shown in FIG. 11C.

The detection of holding of a substrate, shown in FIG. 11B, is also used to confirm whether or not a substrate remains on the hand of the transfer robot 22 after transfer of the substrate.

Figure 12:
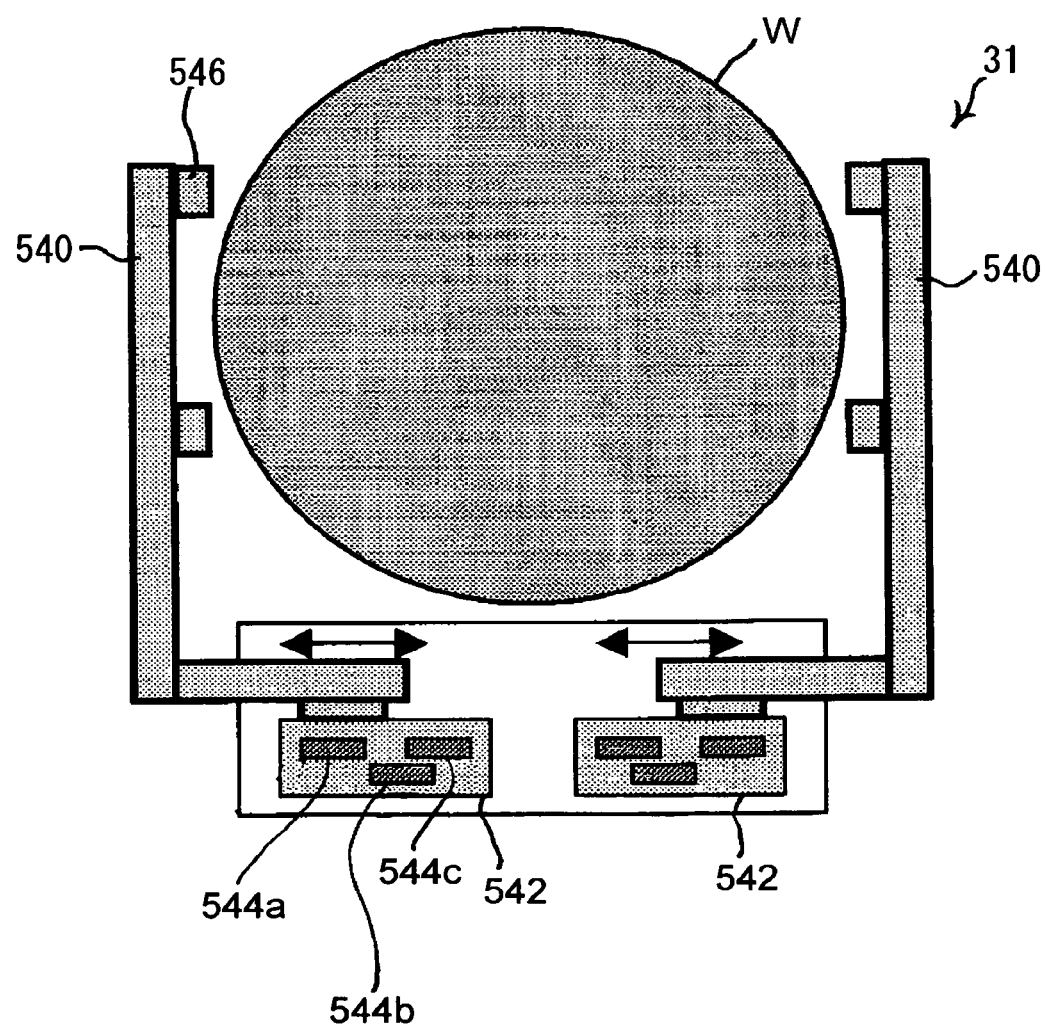
FIG. 12 is a schematic diagram showing a reversing machine, provided in a polishing section of the substrate processing apparatus, together with sensors.

In the reversing machine 31 of the polishing section 3, as shown in FIG. 12, a pair of cylinders 542 for laterally sliding a pair of grip portions 540 are each provided with three cylinder sensors 544a, 544b and 544c for detecting the position of the cylinder 542. The cylinder sensors 544a detect release of gripping of a substrate W by chucking portions 546 of the pair of grip portions 540. The cylinder sensors 544b detect gripping of the substrate W by the chucking portions 546 of the pair of grip portions 540. Further, the cylinder sensors 544c detect failure of gripping of the substrate W by the chucking portions 546 of the pair of grip portions 540. When the substrate W is gripped by the chucking portions 546 of the pair of grip portions 540, the grip portions 540 do not move to their full close positions. In the case of failure of gripping of the substrate W by the grip portions 540, on the other hand, the grip portions 540 move to their full close positions, when they are sensed by the cylinder sensors 544c. Thus, the failure of gripping of the substrate W can be detected by the cylinder sensors 544c.

The above construction is the same with the reversing machine 41 of the cleaning section 4, and the chucking units 461-464 of the transfer unit 46 have a similar construction.

Figure 13:
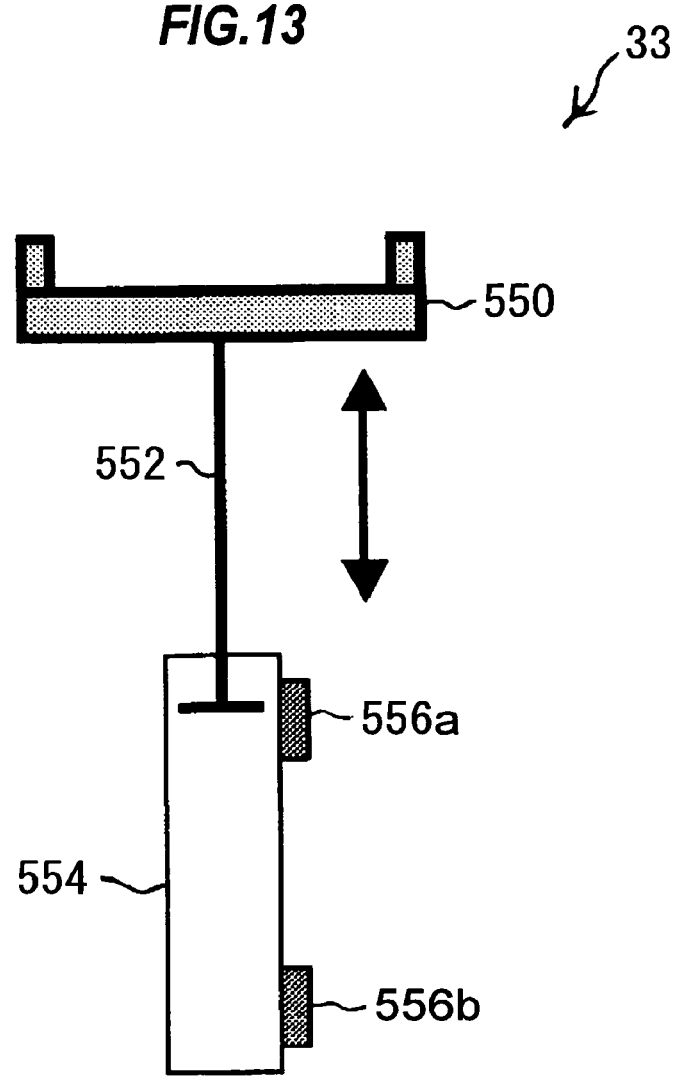
FIG. 13 is a schematic diagram showing a pusher, provided in the polishing section, together with sensors.

In the pusher 33 of the polishing section 3b, as shown in FIG. 13, a cylinder 554 for lifting a rod 552 whose upper end is coupled to a guide stage 550, is provided with cylinder sensors 556a, 556b for detecting the upper end of the cylinder (piston) 554 in its highest position and the lower end of cylinder (piston) 554 in its lowest position, respectively. An operational malfunction is determined when the cylinder sensors 556a, 556b do not detect the cylinder (piston) 554 after the elapse of a certain period of time from the issuance of a command to raise or lower the guide stage 550.

The above construction is the same with the other pushers 33, 34, 37 and 38, and the lifter 32 has a similar construction.

Figure 14:
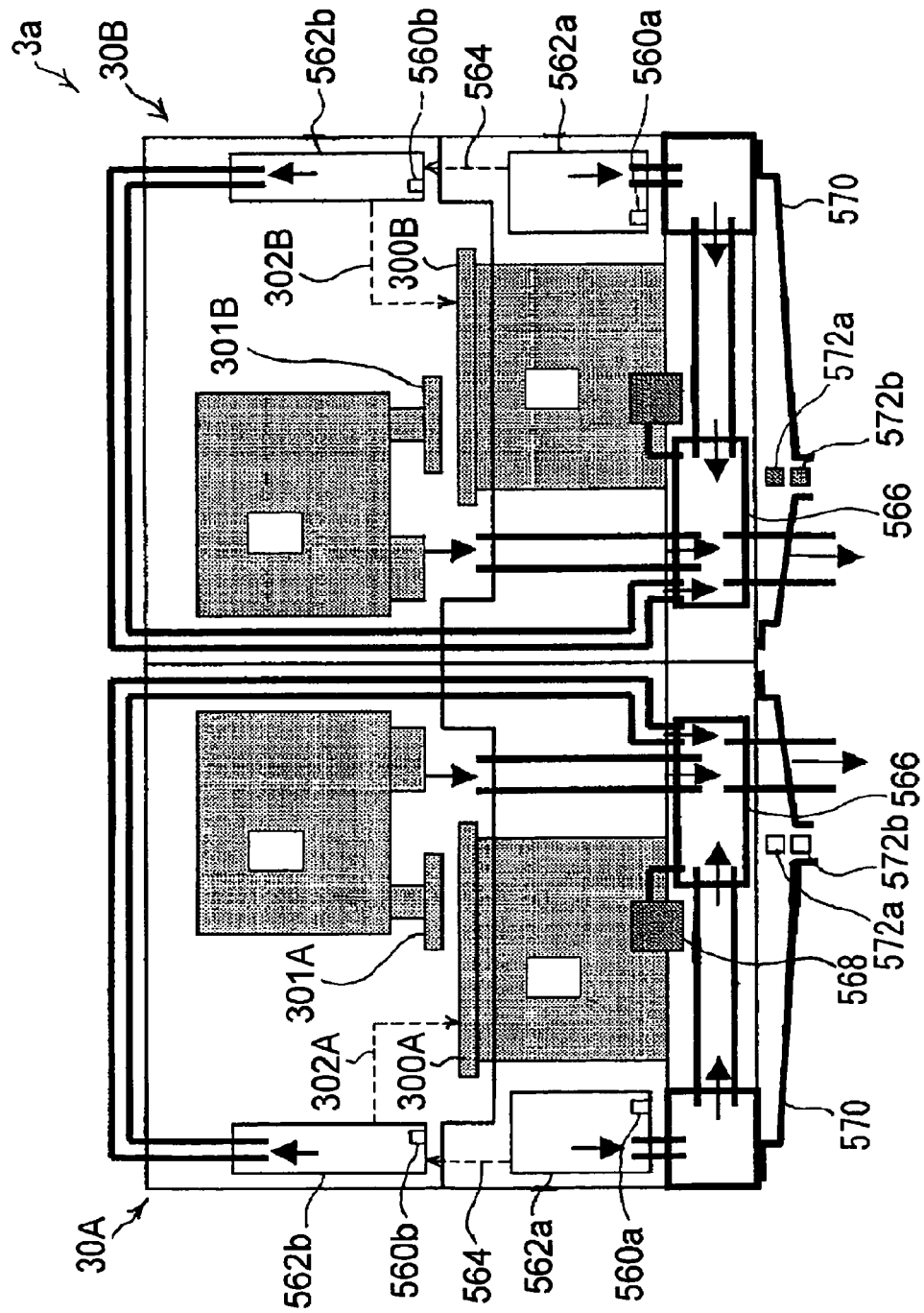
FIG. 14 is a diagram illustrating exhaust pressure sensors and leaked liquid sensors, provided in a first polishing section of the substrate processing apparatus.

In the first polishing unit 30A of the first polishing section 3a, as shown in FIG. 14, slurry boxes 562a, 562b, respectively having leaked liquid sensors 560a, 560b, are disposed on the first and second floors, and the slurry boxes 562a, 562b are connected by a slurry pipe 564. A slurry is supplied to the polishing table 300A through the slurry supply nozzle 302A extending from the slurry box 562a disposed on the second floor. The slurry boxes 562a, 562b respectively communicate with an exhaust box 566 for exhausting air, and an exhaust pressure sensor 568 for detecting the exhaust pressure is attached to the exhaust box 566.

Below the polishing unit 30A is disposed a drain pan 570 which, when the partition between the upper and lower stages has broken and leakage of the slurry has occurred on the upper stage or when leakage of the slurry has occurred on the lower stage, receives the leaked slurry and prevents the slurry from flowing out. An upper first leaked liquid sensor 572a and a lower second leaked liquid sensor 572b, disposed in the same location but at different levels, are provided in the drain pan 570.

The second polishing unit 30B of the first polishing section 3a has a construction similar to the above-described construction of the first polishing unit 30A; and in FIG. 14, the same members of the second polishing unit 30B as those of the first polishing unit 30A are given the same reference numerals. The second polishing section 3b has a similar construction to the first polishing section 3a.

Figure 15:
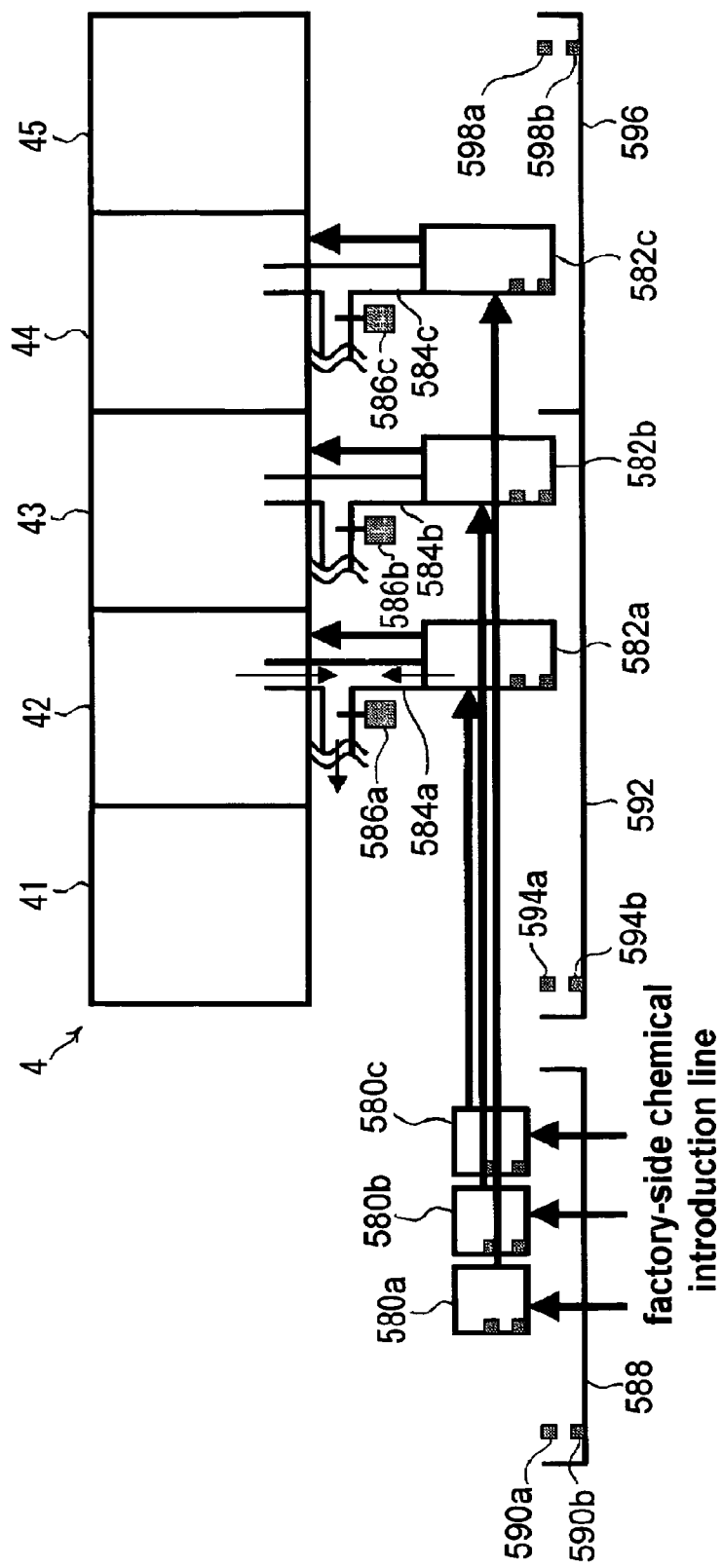
FIG. 15 is a diagram illustrating exhaust pressure sensors and leaked liquid sensors, provided in the cleaning section.

As shown in FIG. 15, the cleaning section 4 has a plurality (e.g., three as shown) of chemical utility boxes 580a, 580b and 580c for temporarily storing liquid chemicals introduced from factory-side chemical introduction lines into the polishing apparatus, and chemical supply boxes 582a, 582b and 582c which communicate with the chemical utility boxes 580a, 580b and 580c, respectively. A liquid chemical (cleaning liquid) is supplied from the chemical supply box 582a to the cleaning device 42, a liquid chemical (cleaning liquid) is supplied from the chemical supply box 582b to the cleaning device 43, and a liquid chemical (cleaning liquid) is supplied from the chemical supply box 582c to the cleaning device 44. An exhaust pressure sensor 586a is provided in an exhaust pipe 589a for exhausting air from the chemical supply box 582a and from the cleaning device 42, an exhaust pressure sensor 586b is provided in an exhaust pipe 584b for exhausting air from the chemical supply box 582b and from the cleaning device 43, and an exhaust pressure sensor 586c is provided in an exhaust pipe 584c for exhausting air from the chemical supply box 582c and from the cleaning device 44.

A drain pan 588 for receiving a leaked chemical is disposed below the chemical utility boxes 580a, 580b and 580c. An upper first leaked liquid sensor 590a and a lower second leaked liquid sensor 590b, disposed in the same location but at different levels, are provided in the drain pan 588.

A drain pan 592 for receiving a leaked chemical is disposed below the reversing machine 41, the cleaning devices 42, 43 and the chemical supply boxes 582a, 582b. An upper first leaked liquid sensor 594a and a lower second leaked liquid sensor 594b, disposed in the same location but at different levels, are provided in the drain pan 592. Further, a drain pan 596 for receiving a leaked chemical is disposed below the cleaning devices 44, 45 and the chemical supply box 582c. An upper first leaked liquid sensor 598a and a lower second leaked liquid sensor 598b, disposed in the same location but at different levels, are provided in the drain pan 596.

Two upper and lower leaked liquid sensors, disposed in the same location but at different levels, are also provided in each of the chemical utility boxes 580a, 580b, and 580c, and the chemical supply boxes 582a, 582b and 582c.

Figure 16:
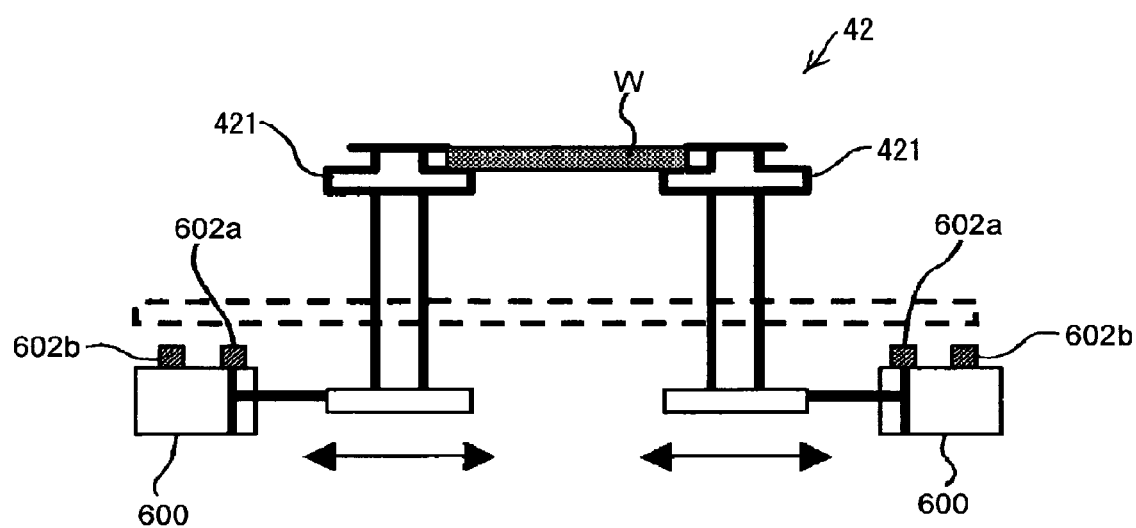
FIG. 16 is a schematic diagram showing the primary cleaning device together with sensors.

In the primary cleaning device 42, as shown in FIG. 16, a cylinder 600 for laterally moving each roller 421 (see FIGS. 3 and 4) is provided with cylinder sensors 602a, 602b for detecting the position of the moving end of the cylinder shaft. The cylinder sensor 602a responds when a substrate W is held by the rollers 421, and the cylinder sensor 602b responds when the holding of the substrate W by the rollers 421 is released. Failure of holding of the substrate W can thus be detected, for example, if the cylinder sensor 602a does not respond even when the cylinder 600 is actuated in order to hold the substrate W by the rollers 421 or when the operation of the cylinder is not completed within a set time.

When the rollers 421 are rotated by the servomotor 422, as shown in FIG. 4, the rotational speed of the servomotor 422 may be detected. The occurrence of a failure in the primary cleaning device 42 can be detected, e.g., when the rotational speed of the servomotor 422 has become slower than a set rotational speed.

When the main frame 465, to which the chucking units 461-464 are mounted, of the transfer unit 46 is moved laterally by driving the servomotor 466, as shown in FIG. 7, the occurrence of a failure in the transfer unit 46 can be detected by obtaining data on the actual position of the main frame 465, and comparing the data value with a set value.

Operations upon detection by sensors of the following malfunctions will now be described. An operational change can be made by temporarily stopping the polishing apparatus, ordering an operating recipe on the screen of the operation panel, and then starting an operation.

(1) Leakage of a Large Amount of Slurry or Chemical

When the upper leaked liquid sensor 572a of the two leaked liquid sensors 572a, 572b shown in FIG. 14, provided in the drain pan 570 disposed below the first plating unit 30A, has responded to a leaked slurry, for example, the operation of the entire apparatus is stopped because of the serious accident of leakage of a large amount of slurry in the first polishing unit 30A. This holds true for the other polishing units 30B, 30C and 30D. Similarly, when at least one of the upper leaked liquid sensors 590a, 594a and 598a shown in FIG. 15, provided in the drain pans 588, 592 and 596, has responded to a leaked chemical, the operation of the entire apparatus is stopped because of the serious accident of leakage of a large amount of chemical in the chemical supply facility.

(2) Leakage of a Small Amount of Slurry or Chemical

When the lower leaked liquid sensor 572b of the two leaked liquid sensors 572a, 572b shown in FIG. 14, provided in the drain pan 570 disposed below the first plating unit 30A, has responded to a leaked slurry, for example, only the operation of feeding new substrates from the substrate cassettes of the front loading portions 20 into the polishing apparatus is stopped, without stopping the operation of the entire apparatus, in view of not serious but minor accident of leakage of a small amount of slurry in the first polishing unit 30A. In particular, processing of substrates present in the polishing apparatus is continued and the substrates, after cleaning and drying, are recovered into the substrate cassettes of the front loading portions 20. After recovering all the substrates present in the polishing apparatus into the substrate cassettes of the front loading portions 20, all the operations of the polishing apparatus are stopped and repair work is conducted on the damaged device or part of the polishing apparatus. This holds true for the other polishing units 30A, 30B and 30D. Similarly, when at least one of the lower leaked liquid sensors 590b, 594b and 598b shown in FIG. 15, provided in the drain pans 538, 592 and 596, has responded to a leaked chemical, only the operation of feeding new substrates from the substrate cassettes of the front loading portions 20 into the polishing apparatus is stopped, without stopping the operation of the entire apparatus, in view of the minor accident of leakage of a small amount of chemical in the first polishing unit 30A. After recovering all the substrates present in the polishing apparatus, all the operations of the polishing apparatus are stopped and repair work is conducted on the damaged device or part of the polishing apparatus.

(3) Exhaust Pressure Malfunction

When the exhaust pressure sensor 568 shown in FIG. 14 or at least one of the exhaust pressure sensors 586a, 586b and 568c shown in FIG. 15 detects that the exhaust pressure is lower than a predetermined value, only the operation of feeding new substrates from the substrate cassettes of the front loading portions 20 into the polishing apparatus is stopped, without stopping the apparatus, insofar as there is no fear of leakage of the atmosphere in the apparatus to the outside. After recovering all the substrates present in the polishing apparatus, all the operations of the polishing apparatus are stopped and repair work is conducted on the damaged device or part of the polishing apparatus.

(4) Failure of the Transfer Robot

Figure 17:
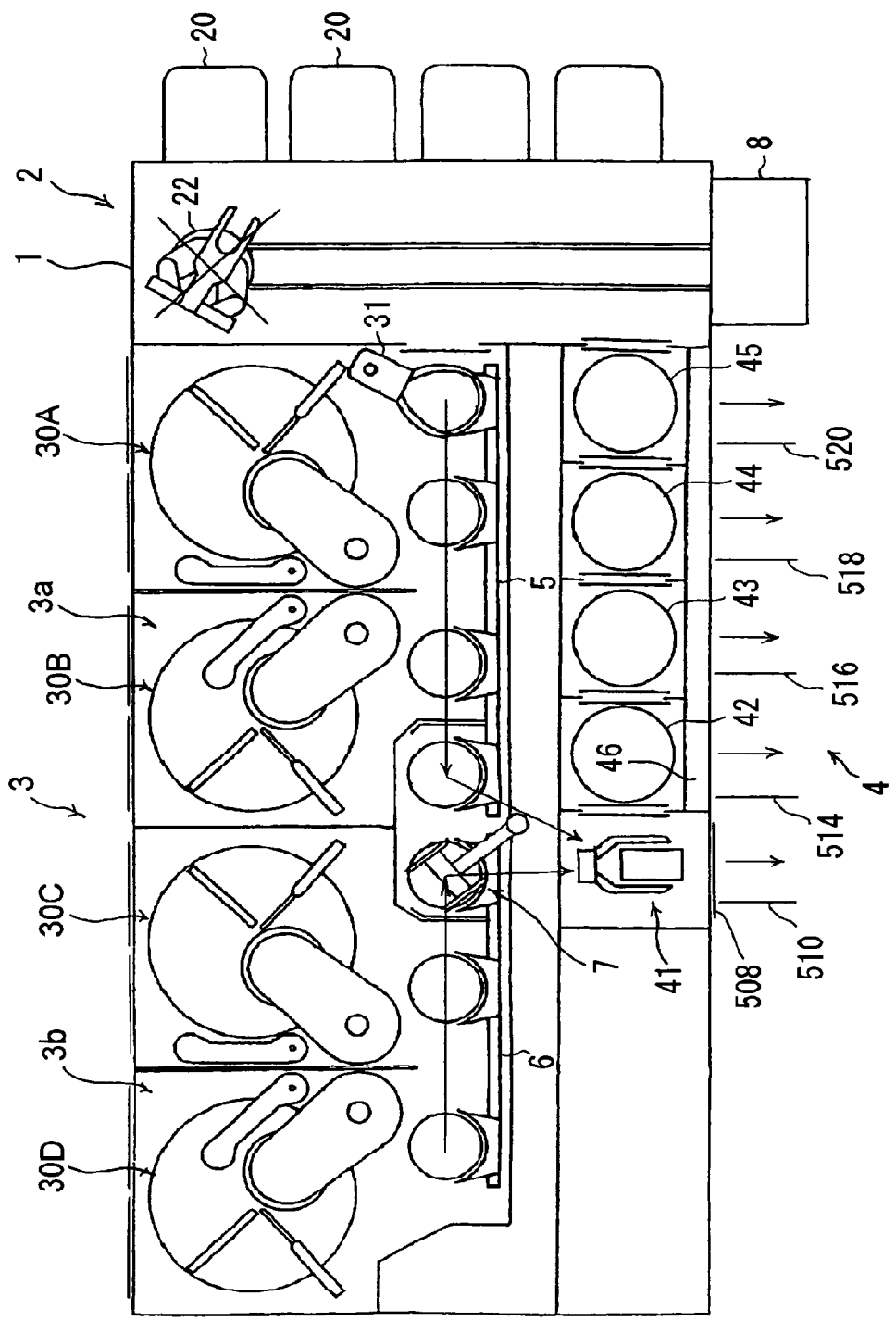
FIG. 17 is a diagram illustrating the flow of a substrate upon the occurrence of a failure of the transfer robot in the loading/unloading section.

When a failure of the transfer robot 22 occurs, as shown by the mark "X" in FIG. 17, it becomes impossible to perform the operation of feeding new substrates from the substrate cassettes of the front loading portions 20 into the polishing apparatus and the operation of recovering substrates, which have been cleaned and dried in the cleaning section 4, into the substrate cassettes of the front loading portions 20. Therefore, when a sensor detects a failure of the transfer robot 22, the operation of feeding new substrates from the substrate cassettes of the front loading portions 20 into the polishing apparatus is stopped, and the operation of the cleaning section 4 is also stopped. On the other hand, the operations of the first polishing section 3a, the second polishing section 3b and the swing transporter 7 are continued. Every time a substrate, present in the first polishing section 3a and the second polishing section 3b, is transferred by the operation of the swing transporter 7 to the reversing machine 41 of the cleaning section 4, the substrate carry-in/carry-out door 510 in front of the reversing machine 41 is opened after releasing the electromagnetic lock of the substrate carry-in/carry-out door 510 through the screen of the operation panel and the reversing machine door 512 is also opened, as shown in FIG. 8, and the substrate on the reversing machine 41 is recovered by taking it out of the apparatus by hand.

It is preferred to provide, e.g., a red lamp and a green lamp on the exterior wall of the apparatus and above the substrate carry-in/carry-out door 510. After the operation for releasing the lock, when the devices are in operation, for example, when a substrate to be recovered has not yet been transferred to the reversing machine 41, the red lamp may be lit to indicate that the substrate carry-in/carry-out door 510 is locked. When it is ready to open the substrate carry-in/carry-out door 510, for example, when a substrate to be recovered has been transferred to the reversing machine 41, the greed lamp may be lit to indicate that the lock is released.

By thus transferring a substrate by the transfer mechanism to the site from which a worker can easily take out the substrate, even a substrate lying in the depth of the apparatus can be recovered easily in a short time.

In the cleaning section 4, the substrate carry-in/carry-out doors 514, 516, 518 and 520 in front of the cleaning devices 42-45 are opened after releasing the electromagnetic locks of the substrate carry-in/carry-out doors 514, 516, 518 and 520, and substrates in the cleaning devices 42-45 are taken by hand out of the apparatus.

It is also possible not to stop the cleaning section 4: substrates are sequentially cleaned in the cleaning devices 42-44, then cleaned and dried in the quaternary cleaning device 45 having a drying function, and then taken out of the apparatus through the open substrate carry-in/carry-out door 520 in front of the quaternary cleaning device 45.

(5) Failure of the First Polishing Section

Figure 18:
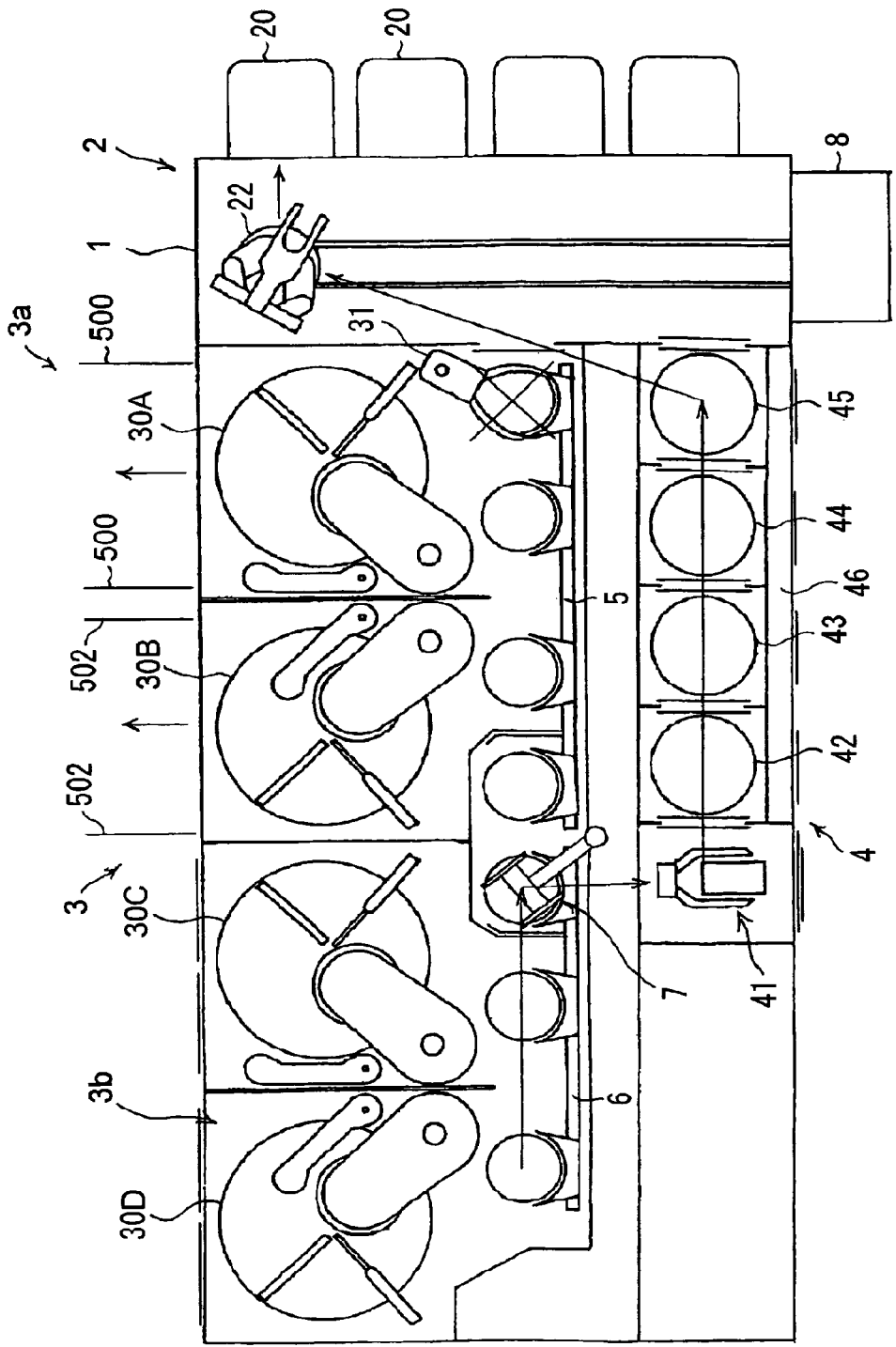
FIG. 18 is a diagram illustrating the flow of a substrate upon the occurrence of a failure of the reversing machine in the first polishing section.

When a failure of, e.g., the reversing machine 31 of the first polishing section 3a occurs, as shown by the mark "X" in FIG. 18, it becomes impossible to carry out processing of a substrate in the first polishing section 3a. Therefore, when a sensor detects a failure of, e.g., the reversing machine 31 of the first polishing section 3a, the operation of feeding new substrates from the substrate cassettes of the front loading portions 20 into the polishing apparatus is stopped, and the operation of the first polishing section 3a is also stopped. On the other hand, the operations of the second polishing section 3b, the swing transporter 7 and the cleaning section 4 are continued. Thus, substrates lying in the polishing apparatus and outside the first polishing section 3a are sequentially cleaned and dried in the cleaning devices 42-45 of the cleaning section 4 and recovered into the substrate cassettes of the front loading portions 20.

After the completion of recovery of the substrates, the maintenance doors 500, 502 of the first polishing section 3a are opened after releasing the electromagnetic locks of the maintenance doors 500, 502 through the screen of the operation panel, and a worker enters the first polishing section 3a through the open maintenance doors 500, 502 and recovers substrates present in the first polishing section 3a. The use of an electromagnetic lock can avoid the risk of a worker accidentally opening a door of the apparatus during normal operation and, when safely is ensured after detection of a malfunction, can quickly open the door to recover a substrate from the apparatus.

Figure 19:
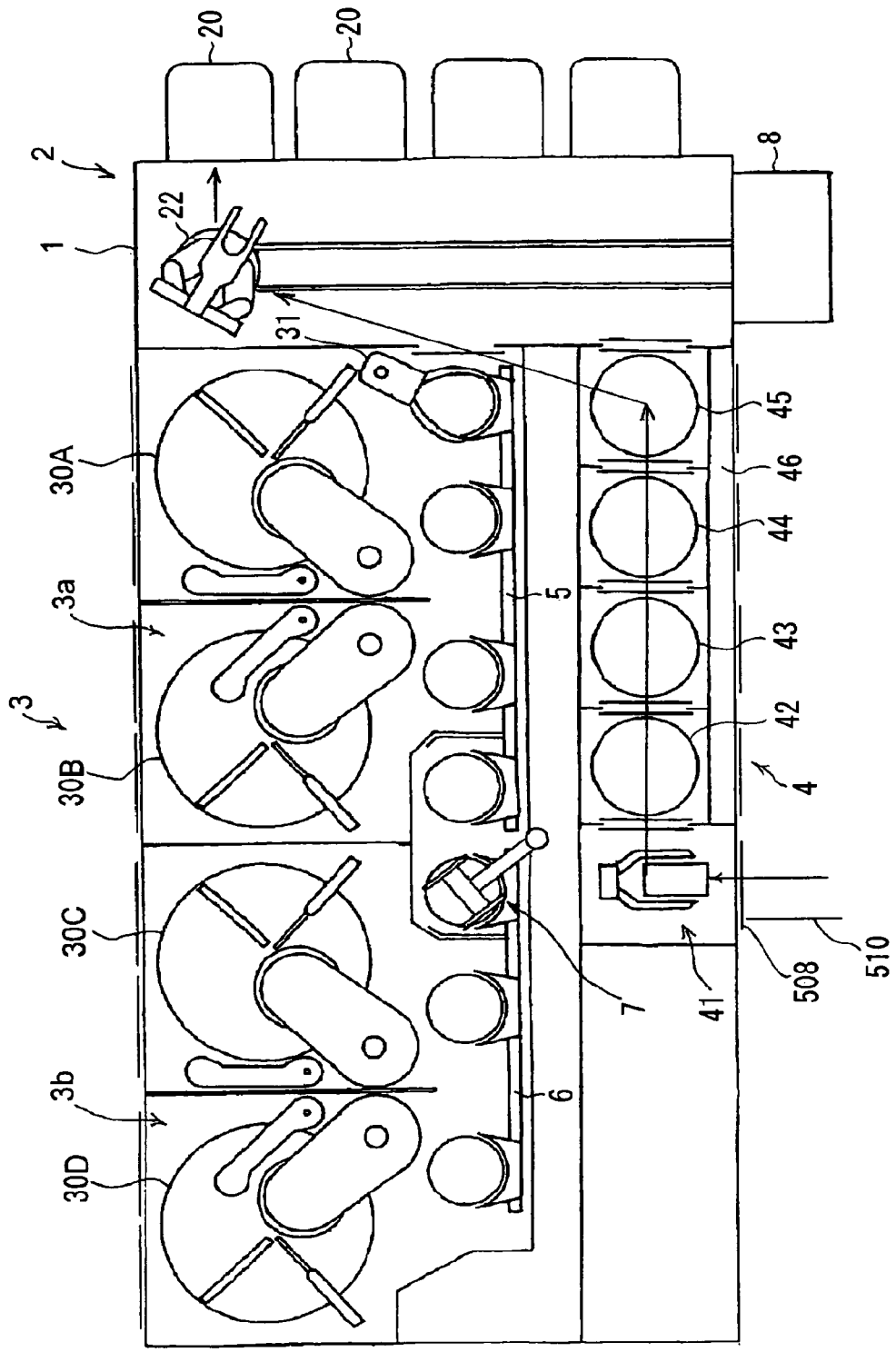
FIG. 19 is a diagram illustrating the flow of a substrate when the substrate is introduced from outside the apparatus and cleaned in the cleaning section.

A substrate, which has been in or before polishing and recovered from the first polishing section 3a, may be treated as follows: The substrate carry-in/carry-out door 510 in front of the reversing machine 41 is opened after releasing the electromagnetic lock of the substrate carry-in/carry-out door 510, as shown in FIG. 19, and the reversing machine door 512 is also opened, as shown in FIG. 8, and the substrate is placed on the reversing machine 41 by hand. Then, after closing the reversing machine door 512 and the substrate carry-in/carry-out door 510, the cleaning section 4 is operated to transfer the substrate on the reversing machine 41 to the cleaning devices 42-45, where the substrate is cleaned and dried, and the dried substrate is recovered into the substrate cassettes of the front loading portions 20.

In cases where a plurality of polishing apparatuses are provided, a substrate, which has been in or before polishing and recovered from the first polishing section 3a, may be cleaned in a cleaning section of another polishing apparatus in normal operation.

A substrate before cleaning, which has been recovered, e.g., from the polishing section of the present polishing apparatus due to an apparatus failure, can thus be prevented from being left for a long period of time without being cleaned.

(6) Failure of the Swing Transporter

Figure 20:
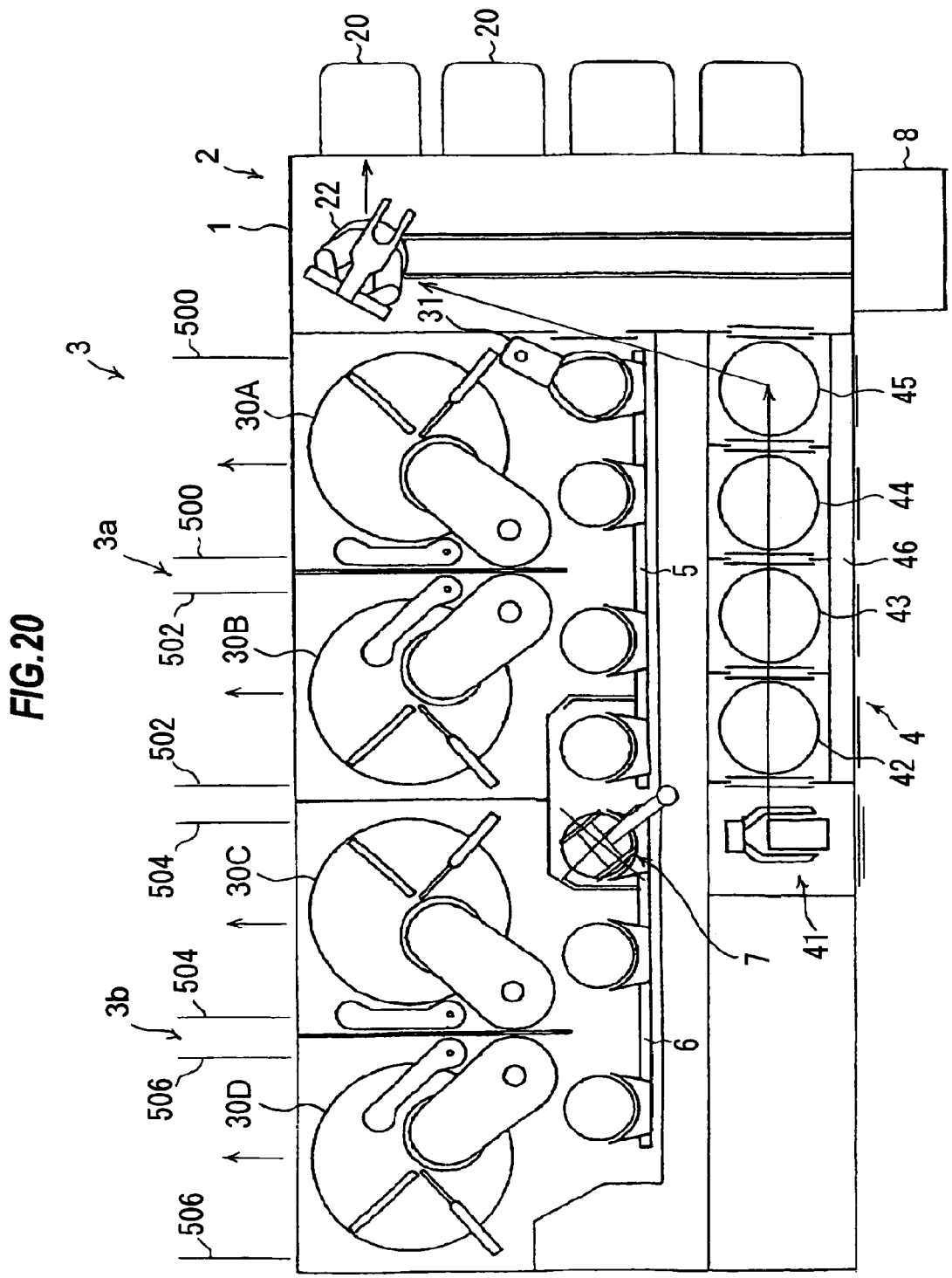
FIG. 20 is a diagram illustrating the flow of a substrate upon the occurrence of a failure of a swing transporter.

When a failure of the swing transporter 7 occurs, as shown by the mark "X" in FIG. 20, it becomes impossible to transfer a substrate between the first linear transporter 5 of the first polishing section 3a and the reversing machine 41 of the cleaning section 4, and transfer a substrate between the second linear transporter 6 of the second polishing section 3b and the reversing machine 41 of the cleaning section 4. Therefore, when a sensor detects a failure of the swing transporter 7, the operation of feeding new substrates from the substrate cassettes of the front loading portions 20 into the polishing apparatus is stopped, and the operations of the first polishing section 3a and the second polishing section 3b are also stopped. On the other hand, the operation of the cleaning section 4 is continued so that substrates lying in the cleaning section 4 are sequentially cleaned and dried in the cleaning devices 42-45, and the dried substrates are recovered into the substrate cassettes of the front loading portions 20.

After the completion of recovery of the substrates, the maintenance doors 500, 502, 504 and 506 surrounding the first polishing section 3a and the second polishing section 3b are opened after releasing the electromagnetic locks of the maintenance doors 500, 502, 504 and 506 though the screen of the operation panel, and a worker enters the first polishing section 3a and the second polishing section 3b through the open maintenance doors 500, 502, 504 and 506, and recovers substrates from the first polishing section 3a and the second polishing section 3b.

In the same manner as described above, substrates, which have been in or before polishing and recovered from the first polishing section 3a and the second polishing section 3b, are placed on the reversing machine 41, cleaned and dried in the cleaning devices 42-45, and recovered into the substrate cassettes of the front loading portions 20, as shown in FIG. 19.

(7) Failure of the Second Polishing Section

Figure 21:
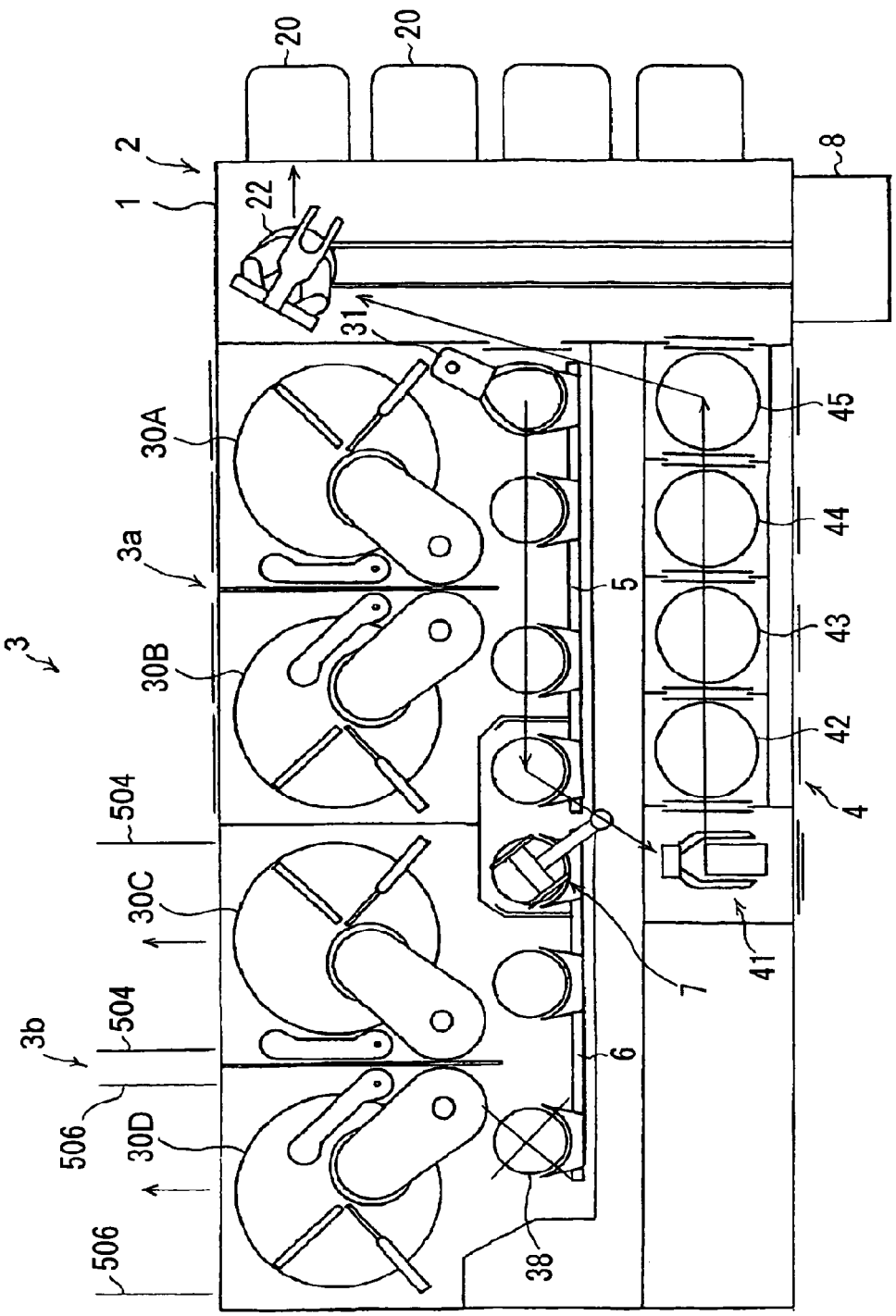
FIG. 21 is a diagram illustrating the flow of a substrate upon the occurrence of a failure of a linear transporter or a pusher in a secondary cleaning section of the substrate processing apparatus.

When a failure of, e.g., the linear transporter 6 or the pusher 38 of the second polishing section 3b occurs, as shown by the mark "X" in FIG. 21, it becomes impossible to carry out processing of a substrate in the second polishing section 3b. Therefore, when a sensor detects a failure of, e.g., the linear transporter 6 or the pusher 38 of the second polishing section 3b, the operation of feeding new substrates from the substrate cassettes of the front loading portions 20 into the polishing apparatus is stopped, and the operation of the second polishing section 3b is also stopped. On the other hand, the operations of the first polishing section 3a, the swing transporter 7 and the cleaning section 4 are continued. Thus, substrates lying in the polishing apparatus and outside the second polishing section 3b are sequentially cleaned and dried in the cleaning devices 42-45 of the cleaning section 4 and recovered into the substrate cassettes of the front loading portions 20.

After the completion of recovery of the substrates, the maintenance doors 504, 506 surrounding the second polishing section 3b are opened after releasing the electromagnetic locks of the maintenance doors 504, 506 through the screen of the operation panel, and a worker enters the second polishing section 3b through the open maintenance doors 504, 506 and recovers substrates from the second polishing section 3b.

In the same manner as described above, substrates, which have been in or before polishing and recovered from the second polishing section 3b, are placed on the reversing machine 41, cleaned and dried in the cleaning devices 42-45, and recovered into the substrate cassettes of the front loading portions 20, as shown in FIG. 19.

(8) Failure of the Reversing Machine of the Cleaning Section

Figure 22:
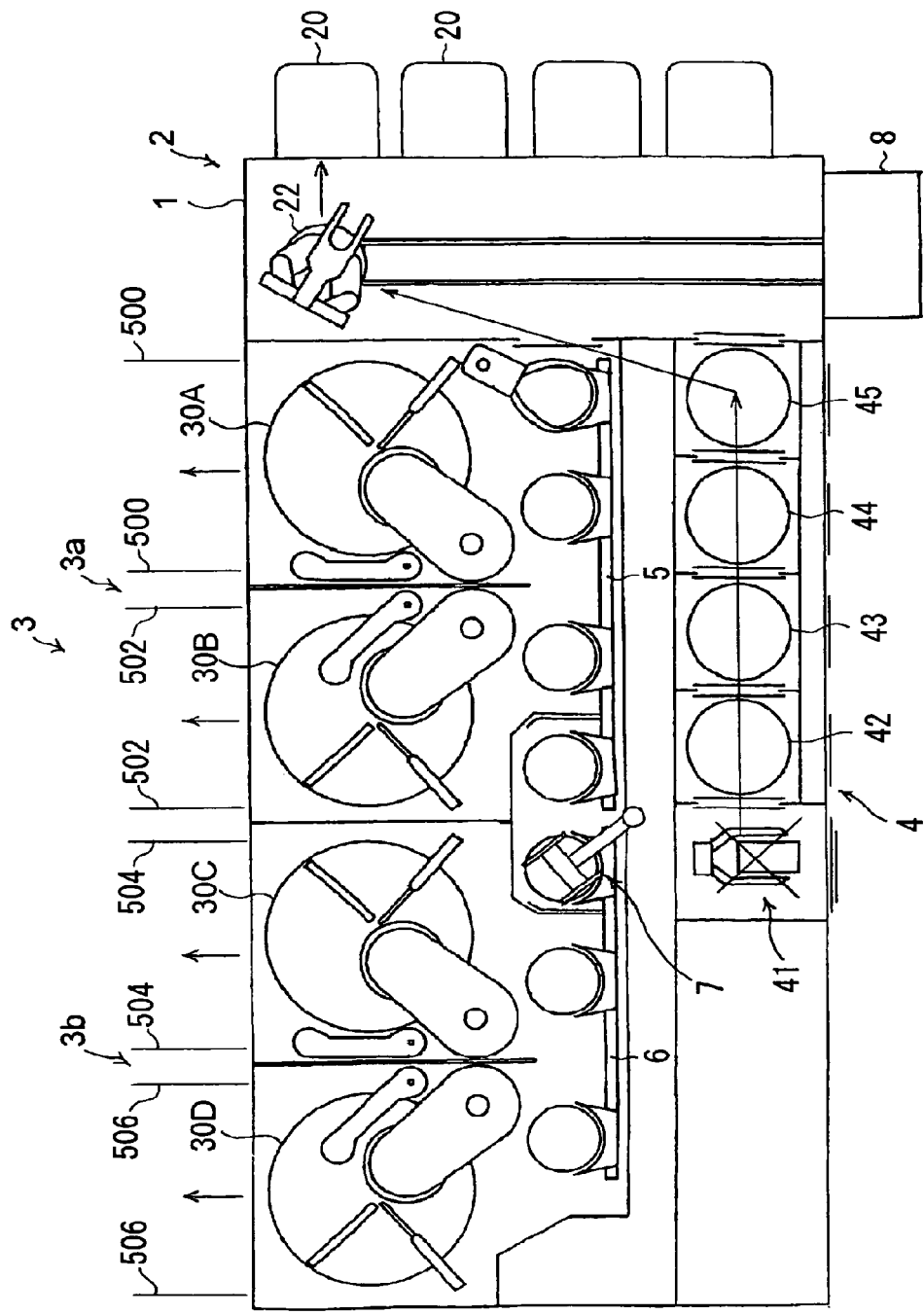
FIG. 22 is a diagram illustrating the flow of a substrate upon the occurrence of a failure of the reversing machine in the cleaning section.

When a failure of the reversing machine 41 of the cleaning section 4 occurs, as shown by the mark "X" in FIG. 22, it becomes impossible to reverse substrates which have been polished in the first polishing section 3a and the second polishing section 3b, and to transfer the substrates to the transfer unit 46 of the cleaning section 4. Therefore, when a sensor detects a failure of the reversing machine 41 of the cleaning section 4, the operation of feeding new substrates from the substrate cassettes of the front loading portions 20 into the polishing apparatus is stopped, and the operations of the first polishing section 3a and the second polishing section 3b are also stopped. On the other hand, the operation of the cleaning section 4 is continued so that substrates lying in the cleaning section 4 are sequentially cleaned and dried in the cleaning devices 42-45, and the dried substrates are recovered into the substrate cassettes of the front loading portions 20.

After the completion of recovery of the substrates, the maintenance doors 500, 502, 504 and 506 surrounding the first polishing section 3a and the second polishing section 3b are opened after releasing the electromagnetic locks of the maintenance doors 500, 502, 504 and 506 through the screen of the operation panel, and a worker enters the first polishing section 3a and the second polishing section 3b through the open maintenance doors 500, 502, 504 and 506 and recovers substrates from the first polishing section 3a and the second polishing section 3b.

In the same manner as described above, substrates, which have been in or before polishing and recovered from the first polishing section 3a and the second polishing section 3b, are placed on the reversing machine 41, cleaned and dried in the cleaning devices 42-45, and recovered into the substrate cassettes of the front loading portions 20, as shown in FIG. 19.

(9) Failure of the Quaternary Cleaning Unit or the Transfer Unit

Figure 23:
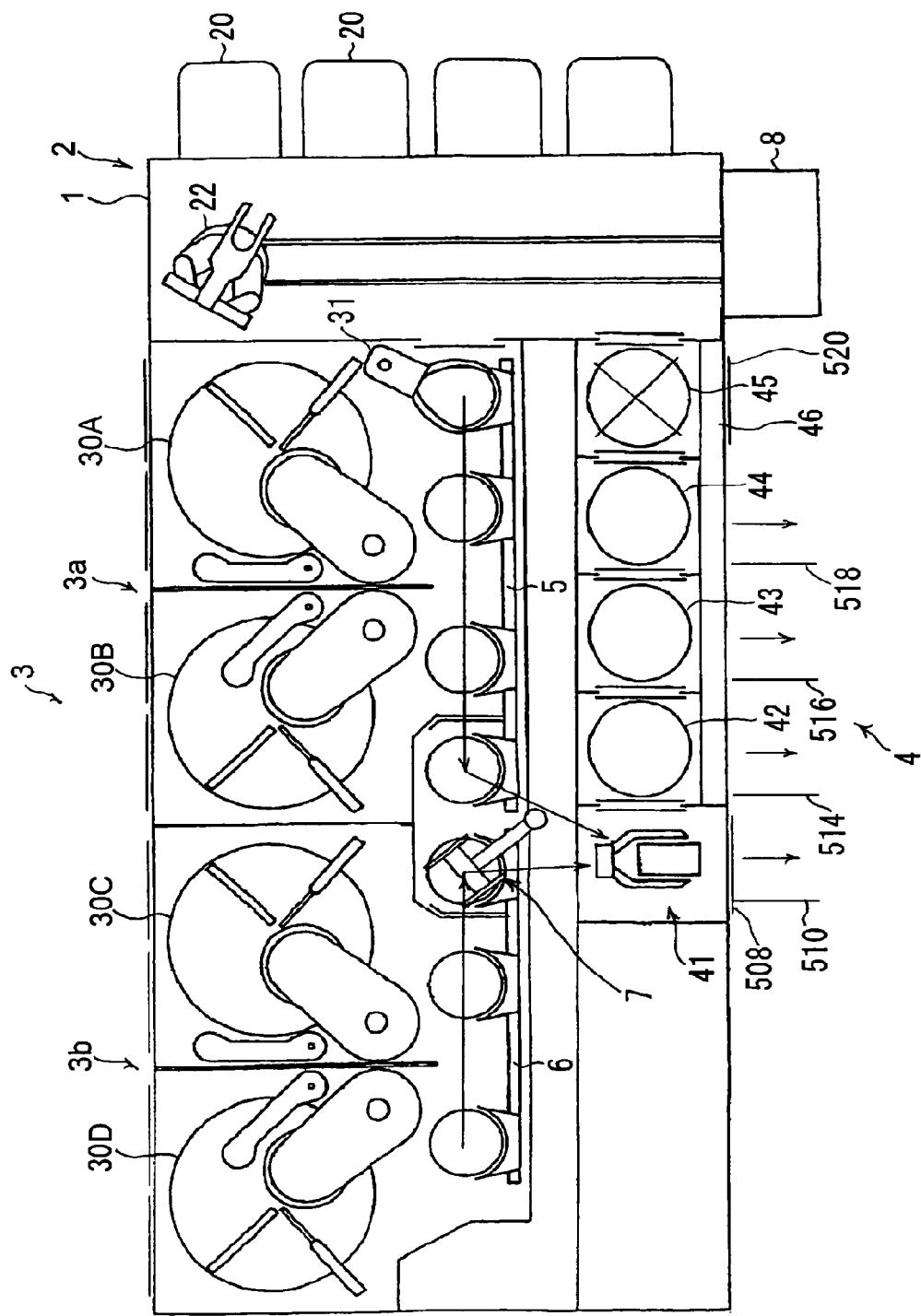
FIG. 23 is a diagram illustrating the flow of a substrate upon the occurrence of a failure of a quaternary cleaning device, having a drying function, in the cleaning section.

When a failure of, e.g., the quaternary cleaning device 45, having a drying function, of the cleaning section 4 occurs, as shown by the mark "X" in FIG. 23, it becomes impossible to recover a dried substrate. Therefore, when a sensor detects a failure of, e.g., the quaternary cleaning device 45, having a drying function, the operation of feeding new substrates from the substrate cassettes of the front loading portions 20 into the polishing apparatus is stopped, and the operation of the cleaning section 4 is also stopped. On the other hand, the operations of the first polishing section 3a, the second polishing section 3b and the swing transporter 7 are continued. Every time a substrate, present in the first polishing section 3a or the second polishing section 3b, is transferred by the swing transporter 7 to the reversing machine 41 of the cleaning section 4, the substrate carry-in/carry-out door 510 in front of the reversing machine 41 is opened after releasing the electromagnetic lock of the substrate carry-in/carry-out door 510 through the screen of the operation panel and the reversing machine door 512 is also opened, as shown in FIG. 8, and the substrate on the reversing machine 41 is taken out of the apparatus by hand.

As described above, it is preferred to provide, e.g., a red lamp and a green lamp on the exterior wall of the apparatus and above the substrate carry-in/carry-out door 510. After the operation for releasing the lock, when the devices are in operation, for example, when a substrate to be recovered has not yet been transported to the reversing machine 41, the red lamp may be lit to indicate that the substrate carry-in/carry-out door 510 is locked. When it is ready to open the substrate carry-in/carry-out door 510, for example, when a substrate to be recovered has been transported to the reversing machine 41, the greed lamp may be lit to indicate that the lock is released.

In the cleaning section 4, the substrate carry-in/carry-out doors 514, 516, 518 and 520 in front of the cleaning devices 42-45 are opened after releasing the electromagnetic locks of the substrate carry-in/carry-out doors 514, 516, 518 and 520, and substrates in the cleaning devices 42-45 are taken by hand out of the apparatus. Alternatively, substrates may be returned from the cleaning devices 42-45 to the reversing machine 41, and the substrates are taken out of the apparatus after opening the substrate carry-in/carry-out door 510 and the reversing machine door 512.

In this case, the recovered substrates after polishing are each placed on a reversing machine of another polishing apparatus in which a cleaning section is in normal operation, and are cleaned and dried in the cleaning section and returned into substrate cassettes of front loading sections of the another polishing apparatus.

Similarly, when a sensor detects a failure of the transfer unit 46 of the cleaning section 4, substrates present in the first polishing section 3a and the second polishing section 3b are sequentially transported to the reversing machine 41 and taken by hand out of the apparatus. Substrates lying in the cleaning devices 42-45 of the cleaning section 4 are taken by hand out of the apparatus through the substrate carry-in/carry-out doors 514, 516, 518 and 520 which have been opened.

(10) Failure of a Cleaning Device of the Cleaning Section

Figure 24:
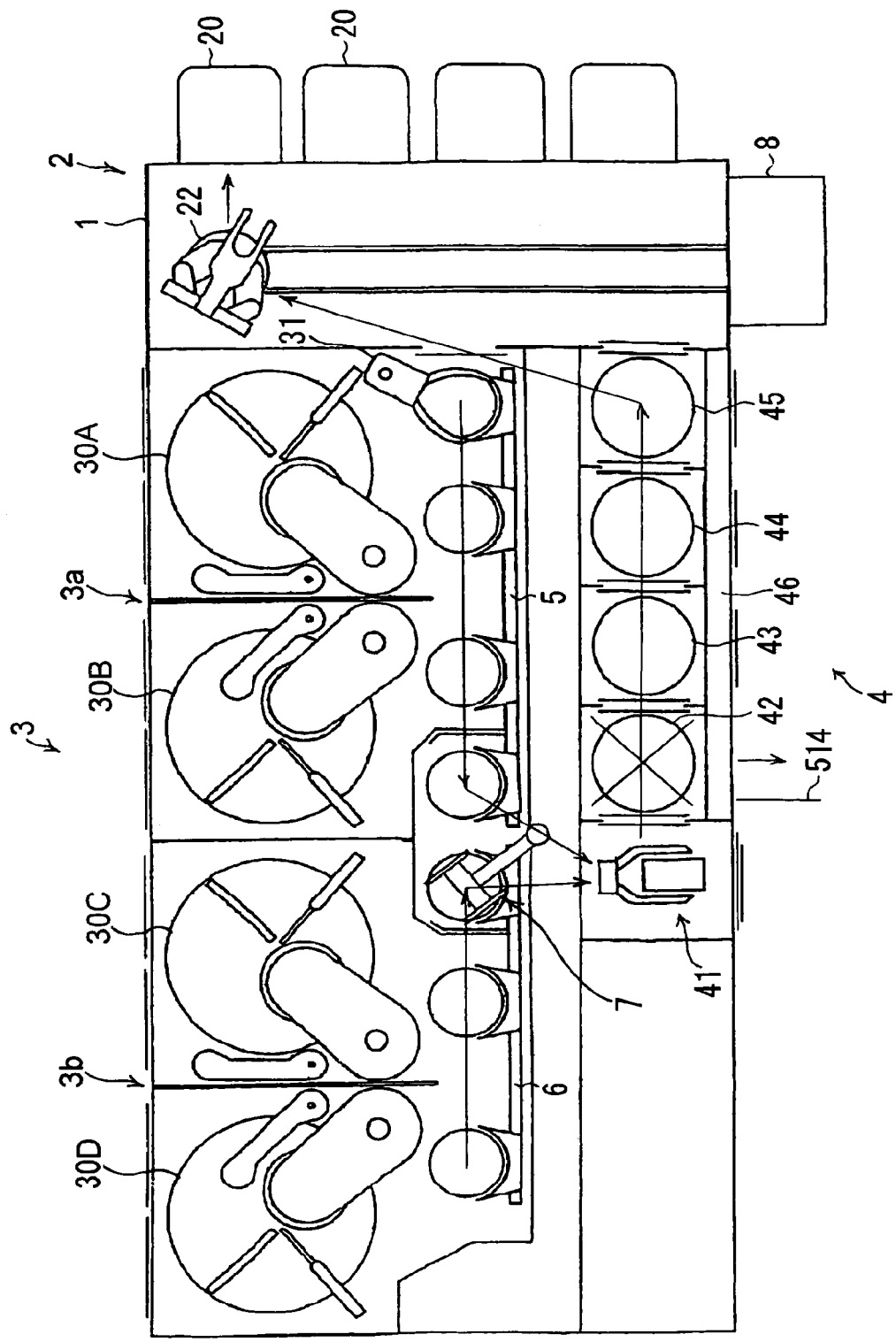
FIG. 24 is a diagram illustrating the flow of a substrate upon the occurrence of a failure of the primary cleaning device in the cleaning section.

When a failure of, e.g., the primary cleaning device 42 of the cleaning section 4 occurs, as shown by the mark "X" in FIG. 24, it becomes impossible to carry out cleaning of a substrate in the primary cleaning device 42. Therefore, when a sensor detects a failure of the primary cleaning device 42, only the operation of the primary cleaning device 42 is stopped. Even when the operation of the primary cleaning device 42 is stopped, the rollers 421 of the primary cleaning device 42 can function as a holder and a substrate can be held on the rollers 421, as shown in FIG. 5. This makes it possible to continue sequentially transferring substrates while skipping the faulty primary cleaning device 42 to clean the substrates in the normal cleaning devices 43-45, and recovering the substrates into the substrate cassettes of the front loading portions 20.

In case a substrate is present in the primary cleaning unit 42 and the substrate hinders transfer of other substrates, the substrate carry-in/carry-out door 514 in front of the primary cleaning device 42 is opened, and the substrate in the primary cleaning device 42 is taken out of the apparatus.

An interrupt processing in a substrate processing apparatus in normal operation will now be described with reference to FIG. 19. Assume that the polishing apparatus (substrate processing apparatus) shown in FIG. 19 is in normal operation, and that a failure has occurred in a not-shown another polishing apparatus (substrate processing apparatus) and a number of substrates before cleaning have been recovered from the faulty substrate processing apparatus. An interrupt processing command is inputted from an operation panel of the polishing apparatus (substrate processing apparatus) in normal operation and, at the same time, the number of the substrates to be processed by interrupt processing and a particular site (front loading portion 20) where the substrates after processing are to be recovered are designated. After the input of the interrupt processing command, the substrate carry-in/carry-out door 510 can be opened and closed safely and easily by the electromagnetic lock for which a locking/unlocking operation is performed on the screen of the operation panel.

In response to the interrupt processing command, the polishing apparatus stops transfer of substrates from the first polishing section 3a and the second polishing section 3b to the cleaning section 4. The substrate carry-in/carry-out door 510 in front of the reversing machine 41 is then opened after releasing the electromagnetic lock of the substrate carry-in/carry-out door 510 and the reversing machine door 512 is also opened, as shown in FIG. 8, and a substrate before cleaning, which has been recovered from the faulty substrate processing apparatus, is placed by hand on the reversing machine 41 of the cleaning section 4. Then, after closing the reversing machine door 512 and the substrate carry-in/carry-out door 510, the cleaning section 4 is operated to transfer the substrate on the reversing machine 41 to the cleaning devices 42-45, where the substrate is cleaned and dried, and the substrate is recovered into the substrate cassette of the front loading portion 20 which has been designated on the operation panel.

It is preferred to provide, e.g., a red lamp and a green lamp on the exterior wall of the apparatus and above the substrate carry-in/carry-out door 510. After the operation for releasing the lock, when it is not ready to carry in a substrate, for example, when the devices are in operation or when a substrate remains on the reversing machine 41, the red lamp may be lit to indicate that the substrate carry-in/carry-out door 510 is locked. When it is ready to carry in a substrate, the greed lamp may be lit to indicate that the lock is released.

After completion of the processing of the designated number of substrates only in the cleaning section 4, transfer of substrates in the first polishing section 3a and the second polishing section 3b is started.

The desire to clean as soon as possible substrates before cleaning, lying in a substrate processing apparatus upon a failure of the apparatus, can be satisfied by thus cleaning the substrates, recovered from the faulty substrate processing apparatus, in a cleaning section of another substrate processing apparatus in normal operation.

It is also possible to stop transfer of substrates from the polishing sections 3a, 3b to the cleaning section 4 by empty transport of a substrate while continuing the operation of the apparatus, i.e., by operating the apparatus as if transferring a substrate, though actually not transferring a substrate. Also in this case, a red lamp and a green lamp, for example, may be provided on the exterior wall of the apparatus and above the substrate carry-in/carry-out door 510, as described above. The green lamp is lit when no substrate has come to be transported onto the reversing machine 41 and, when the green lamp is lit, the substrate carry-in/carry-out door 510 and the reversing machine door 512 are opened, and a substrate before cleaning, which has been recovered from the faulty substrate processing apparatus, is placed by hand on the reversing machine 41 of the cleaning section 4, and the substrate can be cleaned in the cleaning section 4.

By thus processing substrates, recovered from a faulty substrate processing apparatus, in the cleaning section 4 while continuing the operation of the present polishing apparatus in the above-described manner, substrates in the course of processing can be prevented from remaining in the apparatus for such a long time as to adversely affect the substrates.

Though the above description illustrates the polishing apparatus, the present invention is not limited to a polishing apparatus, but is applicable to other types of substrate processing apparatuses.

While the present invention has been described with reference to the embodiments thereof, it will be understood by those skilled in the art that the present invention is not limited to the particular embodiments described above, but it is intended to cover modifications within the inventive concept.

What is claimed is:

1. An apparatus for processing a substrate, the apparatus comprising:
    a first processing section for carrying out a first processing of a substrate;
    a second processing section for carrying out a second processing of the substrate;
    a transferring mechanism for transferring the substrate from the first processing section to the second processing section;
    a sensor which detects a malfunction in the apparatus;
    a door with a lock; and
    an operation panel operable to control the lock such that the door remains locked during normal operation of the apparatus and is unlocked after the sensor detects occurrence of the malfunction in the apparatus, in order to recover the substrate, before or after the first processing, from the apparatus and feed the substrate into the apparatus for carrying out the second processing of the substrate.

2. The apparatus of claim 1, wherein the first processing section is a polishing section and the second processing section is a cleaning section.

3. The apparatus of claim 1, wherein the lock is an electromagnetic lock.

4. The apparatus of claim 1, wherein the door is a maintenance door, and the apparatus further comprises a substrate carry-in/carry-out door which has a lock and is unlocked by the operation panel in response to an interrupt processing signal even during normal operation of the apparatus.

5. The apparatus of claim 4, wherein the first processing section is a polishing section and the second processing section is a cleaning section.

6. An apparatus for processing a substrate, the apparatus comprising:
 a first processing section for carrying out a first processing of a substrate;
 a second processing section for carrying out a second processing of the substrate;
 a transferring mechanism for transferring the substrate from the first processing section to the second processing section;
 a sensor which detects a malfunction in the apparatus;
 a door with a lock; and
 an operation panel operable to control the lock such that the door remains locked during normal operation of the apparatus and is unlocked after the sensor detects occurrence of the malfunction in the apparatus, in order to recover the substrate, before or after the first processing, from the apparatus and feed the substrate into the apparatus for carrying out the second processing of the substrate,
 wherein the door is a maintenance door, and the apparatus further comprises a substrate carry-in/carry-out door which opens to access the transferring mechanism, and
 wherein the substrate carry-in/carry-out door has a lock which is unlocked by the operation panel in response to an interrupt processing signal even during normal operation of the apparatus.

7. The apparatus of claim 6, wherein the first processing section is a polishing section and the second processing section is a cleaning section.

8. The apparatus of claim 6, wherein the substrate carry-in/carry-out door is provided in the maintenance door.

\* \* \* \* \*